United States Patent
Kato et al.

(10) Patent No.: US 11,952,661 B2
(45) Date of Patent: *Apr. 9, 2024

(54) DEPOSITION METHOD

(71) Applicant: Tokyo Electron Limited, Tokyo (JP)

(72) Inventors: Hitoshi Kato, Iwate (JP); Kazumi Kubo, Iwate (JP); Yutaka Takahashi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 346 days.

This patent is subject to a terminal disclaimer.

(21) Appl. No.: 16/506,143

(22) Filed: Jul. 9, 2019

(65) Prior Publication Data

US 2020/0017968 A1    Jan. 16, 2020

(30) Foreign Application Priority Data

Jul. 13, 2018   (JP) ................................ 2018-133602

(51) Int. Cl.
*C23C 16/455*   (2006.01)
*C23C 16/34*    (2006.01)
(Continued)

(52) U.S. Cl.
CPC ...... *C23C 16/45542* (2013.01); *C23C 16/345* (2013.01); *C23C 16/45565* (2013.01);
(Continued)

(58) Field of Classification Search
CPC ........ C23C 16/45542; C23C 16/45565; C23C 16/345; C23C 16/45551; C23C 16/45534;
(Continued)

(56) References Cited

U.S. PATENT DOCUMENTS

| 5,178,682 A | 1/1993 | Tsukamoto et al. |
| 7,504,681 B2 | 3/2009 | Lim |

(Continued)

FOREIGN PATENT DOCUMENTS

| JP | 2000-174007 | 6/2000 |
| JP | 2004-281853 | 10/2004 |

(Continued)

OTHER PUBLICATIONS

Oh et al. "Accurate Measurement of Atomic Chlorine Radical Density in Process Plasma with Spatially Resolvable Optical Emission Spectrometer" (2015). International Journal of Precision engineering and Manufacturing vol. 16, No. 8. pp. 1919-1924 (Jul. 2015).

*Primary Examiner* — Dah-Wei D. Yuan
*Assistant Examiner* — Nga Leung V Law
(74) *Attorney, Agent, or Firm* — IPUSA, PLLC

(57) ABSTRACT

A deposition method includes: forming an adsorption inhibiting region on an adsorption site formed on a substrate, by causing the adsorption site to adsorb adsorption inhibiting radicals by a predetermined amount; causing an area on the adsorption site, on which the adsorption inhibiting region is not formed, to adsorb a raw material gas; and depositing a film of a reaction product on the adsorption site by causing the raw material gas adsorbed on the adsorption site to react with a reactant gas activated by a plasma.

20 Claims, 18 Drawing Sheets

(51) Int. Cl.
*H01J 37/32* (2006.01)
*H01L 21/02* (2006.01)

(52) U.S. Cl.
CPC ...... *H01J 37/321* (2013.01); *H01J 37/32357* (2013.01); *H01J 37/32449* (2013.01); *H01L 21/0217* (2013.01); *H01L 21/02274* (2013.01); *H01L 21/0228* (2013.01); *H01J 2237/3321* (2013.01)

(58) Field of Classification Search
CPC .............. C23C 16/45578; C23C 16/34; C23C 16/45536; H01J 37/321; H01J 37/32357; H01J 37/32449; H01J 2237/3321; H01L 21/02274; H01L 21/0217; H01L 21/0228; H01L 21/68764; H01L 21/68771; H01L 21/02211; H01L 21/02247
See application file for complete search history.

(56) References Cited

U.S. PATENT DOCUMENTS

| | | | |
|---|---|---|---|
| 8,900,963 B2 | 12/2014 | Sills et al. | |
| 8,956,984 B2 | 2/2015 | Okuda | |
| 9,177,786 B2 | 11/2015 | Sano et al. | |
| 10,026,606 B2 | 7/2018 | Kato et al. | |
| 10,312,078 B2 | 6/2019 | Murakami et al. | |
| 2006/0199399 A1 | 9/2006 | Muscat | |
| 2007/0269982 A1* | 11/2007 | Rocklein | C23C 16/44 438/680 |
| 2008/0242097 A1 | 10/2008 | Boescke et al. | |
| 2011/0159187 A1* | 6/2011 | Kato | H01L 21/0228 118/719 |
| 2012/0052693 A1 | 3/2012 | Ozaki et al. | |
| 2013/0171822 A1* | 7/2013 | Chandrashekar | H01L 21/28556 438/675 |
| 2014/0051263 A1 | 2/2014 | Tanaka et al. | |
| 2014/0199854 A1 | 7/2014 | Chen et al. | |
| 2014/0209562 A1 | 7/2014 | La Voie et al. | |
| 2014/0213037 A1* | 7/2014 | LiCausi | H01L 21/3105 438/429 |
| 2015/0099374 A1 | 4/2015 | Kakimoto et al. | |
| 2015/0217330 A1 | 8/2015 | Haukka et al. | |
| 2016/0013042 A1 | 1/2016 | Hashimoto et al. | |
| 2017/0125238 A1* | 5/2017 | Hasebe | H01L 21/0228 |
| 2017/0140920 A1 | 5/2017 | Arnepalli et al. | |
| 2017/0140931 A1 | 5/2017 | Van Cleemput et al. | |
| 2018/0237912 A1 | 8/2018 | Takahashi et al. | |
| 2018/0330980 A1* | 11/2018 | Liang | H01L 21/02274 |
| 2019/0051511 A1 | 2/2019 | Kato et al. | |
| 2019/0051512 A1 | 2/2019 | Kato et al. | |
| 2019/0287787 A1 | 9/2019 | Nishino et al. | |

FOREIGN PATENT DOCUMENTS

| | | |
|---|---|---|
| JP | 2012-138501 | 7/2012 |
| JP | 2013-135154 | 7/2013 |
| JP | 2017-092098 | 5/2017 |
| JP | 2017-112258 | 6/2017 |
| JP | 2017-139306 | 8/2017 |
| KR | 10-2015-0101431 | 9/2015 |
| KR | 10-2017-0000351 | 1/2017 |
| WO | 2004/079813 | 9/2004 |

\* cited by examiner (a)

(b)

(a)

(b)

DEPOSITION METHOD

CROSS-REFERENCE TO RELATED APPLICATIONS

This patent application is based upon and claims priority to Japanese Patent Application No. 2018-133602 filed on Jul. 13, 2018, the entire contents of which are incorporated herein by reference.

TECHNICAL FIELD

The present disclosure relates to a deposition method.

BACKGROUND

Conventionally, a method of forming a nitride film in a fine recess formed on a surface of a substrate is known. In the method, by repeating an adsorption step of causing the substrate to adsorb a raw material gas containing chlorine and an element constituting a nitride film to be formed on the surface of the substrate, and a nitriding step of nitriding the adsorbed raw material gas with nitriding active species, the nitride film is formed in the fine recess on the surface of the substrate. In the intruding step, NH* active species and N* active species are formed as the nitriding active species, and concentration of these active species are controlled to change an area in the fine recess on which the raw material gas adsorbs (See Patent Document 1, for example).

In such a method of forming a nitride film, at an initial stage, a conformal nitride film is formed by using NH* active species during the nitriding step. Subsequently, the nitride film is grown from a bottom of the fine recess, by continuously decreasing concentration of N* active species from a state in which the concentration of N* active species is high. By performing the above-described process, bottom-up growth of the nitride film occurs from the bottom of a trench, and the growth of the nitride film can be changed to conformal growth with high concentration of NH* active species. Thus, the nitride film can be implanted in a fine trench without forming voids or seams.

CITATION LIST

Patent Document

[Patent Document 1] Japanese Laid-open Patent Application Publication No. 2017-92098

In order to refine the nitride film, it is necessary to activate the nitride gas by the plasma to increase the nitriding capability. However, even if the plasma nitriding is continued for a long time, nitridation may become saturated and quality of the film may not improve. In addition, quality control of the film is extremely difficult, and in many cases, effective measures cannot be found when nitridation is saturated.

SUMMARY

The present disclosure aims at providing a deposition method capable of controlling film quality.

A deposition method according to an aspect of the present disclosure includes: forming an adsorption inhibiting region on an adsorption site formed on a substrate, by causing the adsorption site to adsorb adsorption inhibiting radicals by a predetermined amount; causing an area on the adsorption site, on which the adsorption inhibiting region is not formed, to adsorb a raw material gas; and depositing a film of a reaction product on the adsorption site by causing the raw material gas adsorbed on the adsorption site to react with a reactant gas activated by a plasma.

DETAILED DESCRIPTION OF EMBODIMENTS

Hereinafter, an embodiment for carrying out the present invention will be described with reference to the drawings.
[Deposition Apparatus]

Figure 1:
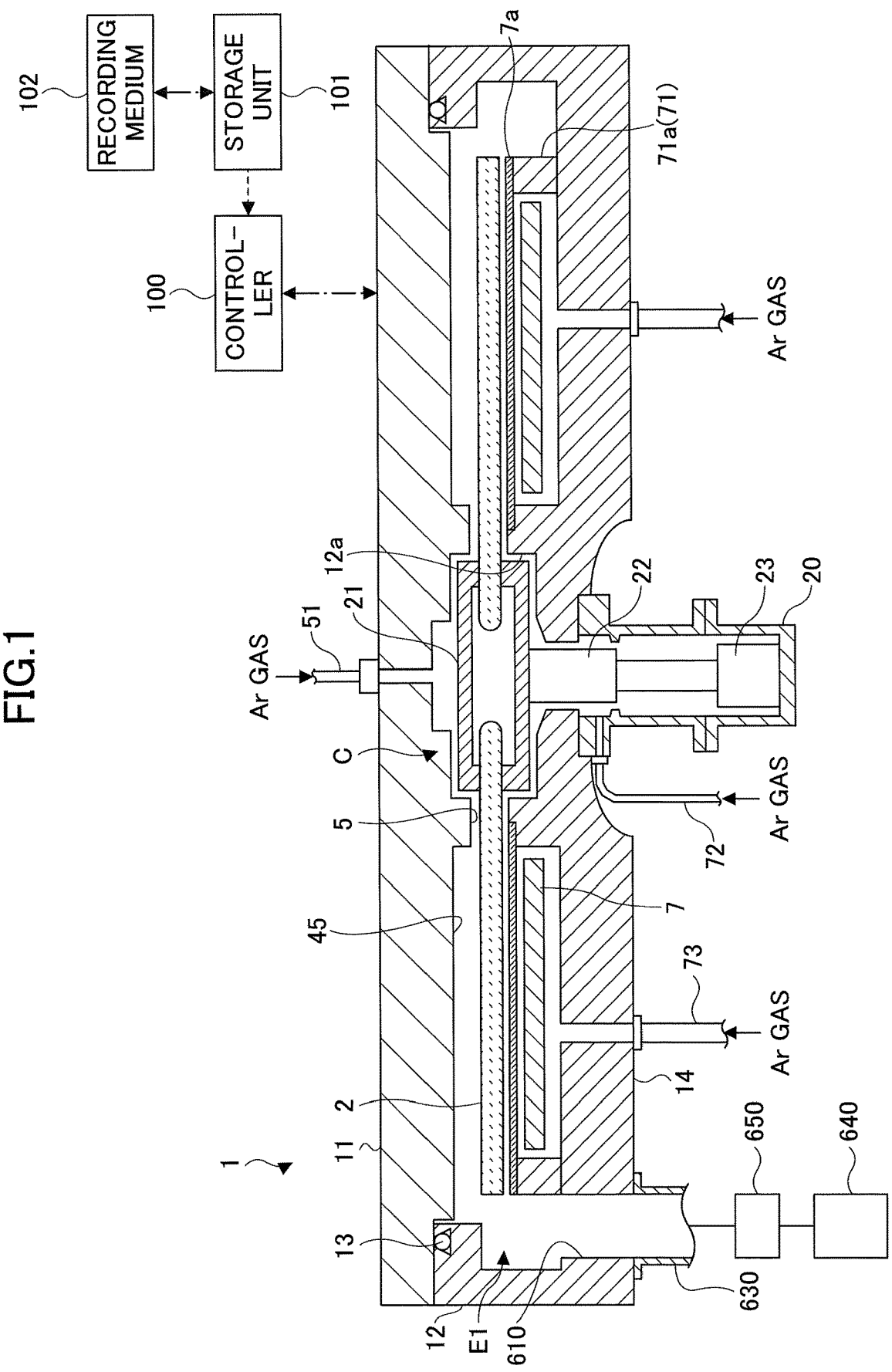
FIG. 1 is a schematic cross-sectional view illustrating a deposition apparatus applicable to a deposition method according to an embodiment of the present disclosure.
Figure 2:
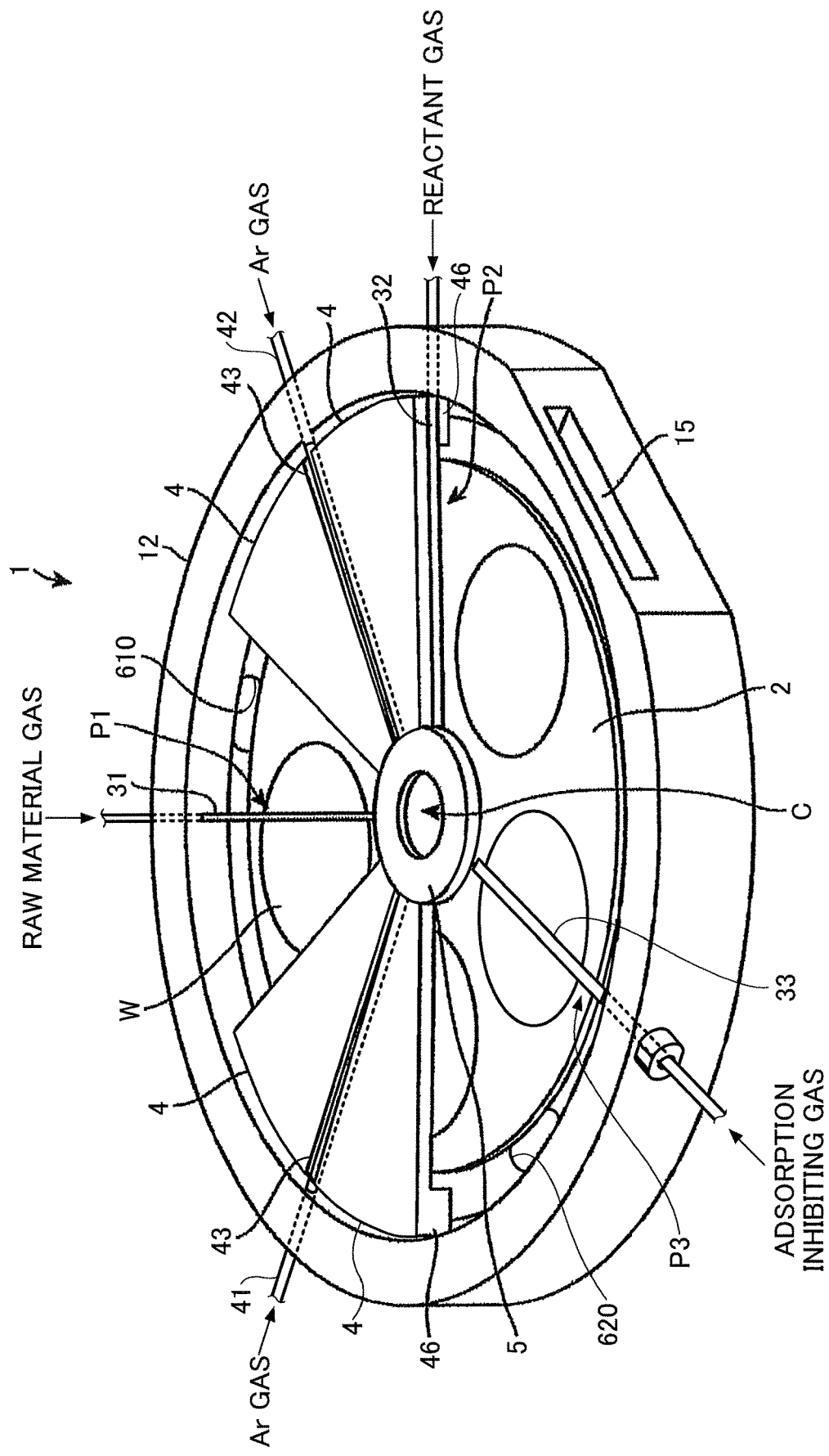
FIG. 2 is a schematic perspective view illustrating a configuration of an interior of a vacuum vessel of the deposition apparatus.
Figure 3:
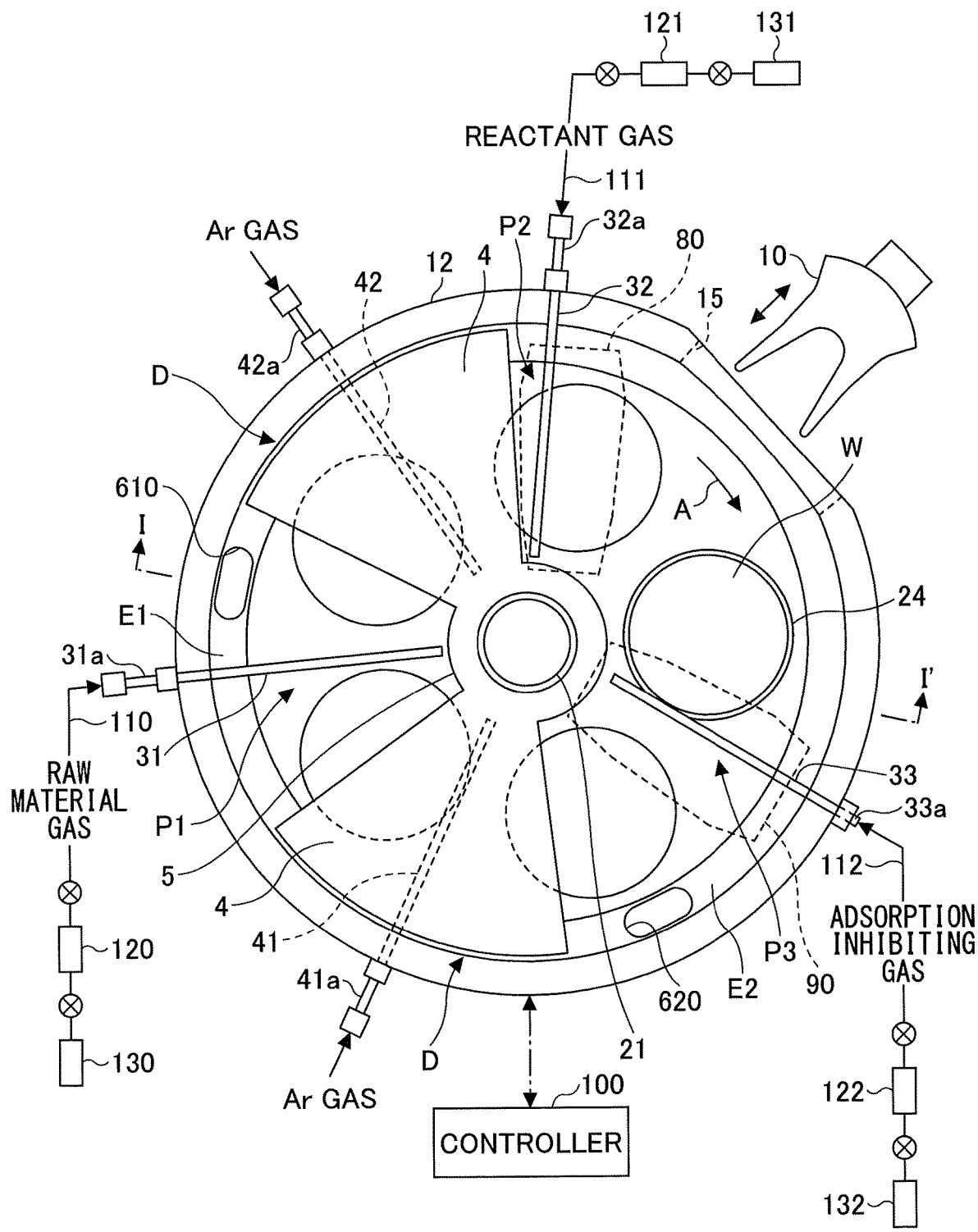
FIG. 3 is a schematic plan view illustrating a configuration of the interior of the vacuum vessel of the deposition apparatus.

First, a deposition apparatus suitably used in a deposition method according to the embodiment of the present invention will be described. Referring to FIGS. 1 to 3, the deposition apparatus according to the present embodiment includes a flat vacuum vessel 1 having a substantially circular planar shape, and a rotary table 2 disposed within the vacuum vessel 1 having a rotational center at a center of the vacuum vessel 1. The vacuum vessel 1 is a processing chamber for applying a deposition process to a surface of a wafer that is loaded in the vacuum vessel 1. The vacuum vessel 1 includes a vessel body 12 having a cylindrical shape including a bottom portion, and a top plate 11 which is removably disposed at the top surface of the vessel body 12. Because the top plate 11 is attached to the vessel body 12 via a seal member 13 (FIG. 1) such as an O-ring, the vacuum vessel 1 is hermetically sealed by the seal member 13.

The rotary table 2 is fixed to a cylindrical core 21 at the center of the rotary table 2. The core 21 is fixed to an upper end of a rotating shaft 22 extending vertically. The rotating shaft 22 passes through a bottom portion 14 of the vacuum vessel 1, and a lower end of the rotating shaft 22 is attached to an actuating unit 23 which rotates the rotating shaft 22 (FIG. 1) about the vertical axis. The rotating shaft 22 and the actuating unit 23 are housed in a cylindrical casing 20 having an open upper surface. The casing 20 is hermetically mounted on a bottom surface of the bottom portion 14 of the vacuum vessel 1 with a flange portion provided on an upper surface of the casing 20, and the internal atmosphere of the casing 20 is isolated from the external atmosphere.

As illustrated in FIG. 2 and FIG. 3, multiple circular recesses 24 are provided on a surface of the rotary table 2 (five recesses 24 are provided in the drawings) along a rotating direction (circumferential direction). Each of the recesses 24 is used for placing a semiconductor wafer (hereinafter referred to as a "wafer") W, which is a substrate. For convenience, FIG. 3 illustrates a case in which a wafer W is placed on only one of the recesses 24. The recess 24 has an inner diameter slightly larger (4 mm larger for example) than a diameter of the wafer W, and has a depth that is approximately equal to a thickness of the wafer W. Thus, when the wafer W is placed in the recess 24, the surface of the wafer W and the surface of the rotary table 2 (an area on which the wafer W is not placed) become the same level. On a bottom surface of the recess 24, for example, through-holes are provided, and three lift pins pass through the through-holes (the through-holes and the lift pins are not illustrated in the drawings). The lift pins support the back surface of the wafer W to raise and lower the wafer W.

FIGS. 2 and 3 are diagrams for illustrating a structure inside the vacuum vessel 1, and for the sake of description, illustration of the top plate 11 is omitted. As illustrated in FIGS. 2 and 3, a reactant gas nozzle 31, a reactant gas nozzle 32, a reactant gas nozzle 33, and separation gas nozzles 41 and 42, each of which is made of quartz, are arranged at intervals in the circumferential direction of the vacuum vessel 1 (rotating direction of the rotary table 2 (arrow A in FIG. 3). In the illustrated example, the reactant gas nozzle 33, the separation gas nozzle 41, the reactant gas nozzle 31, the separation gas nozzle 42, and the reactant gas nozzle 32 are arranged in this order clockwise (in the rotating direction of the rotary table 2) from a conveying port 15 to be described below. These nozzles 31, 32, 33, 41, and 42 are introduced from an outer circumferential wall of the vacuum vessel 1 into the vacuum vessel 1 by fixing the gas inlet ports 31a, 32a, 33a, 41a, and 42a (FIG. 3), which are extreme ends of the respective nozzles 31, 32, 33, 41, and 42, to the outer circumferential wall of the vessel body 12, and are installed to extend horizontally with respect to the rotary table 2 along a radial direction of the vessel body 12.

In the present embodiment, as illustrated in FIG. 3, the reactant gas nozzle 31 is connected to a raw material gas supply source 130, such as through a pipe 110 and a flow controller 120. The reactant gas nozzle 32 is connected to a reactant gas supply source 131, such as through a pipe 111 and a flow controller 121. Further, the reactant gas nozzle 33 is connected to an adsorption inhibiting gas supply source 132, such as through a pipe 112 and a flow controller 122. Both the separation gas nozzles 41 and 42 are connected to a source of separation gas (not illustrated), such as through pipes and flow control valves (not illustrated). As the separation gas, a rare gas such as helium (He) or argon (Ar), or an inert gas such as nitrogen ($N_2$) gas can be used. In the present embodiment, an example of using Ar gas will be described.

In the reactant gas nozzles 31, 32, and 33, multiple gas discharge holes 35 facing the rotary table 2 are arranged at intervals of 10 mm, for example, along a longitudinal direction of the reactant gas nozzles 31, 32, and 33. A region below the reactant gas nozzle 31 is a first processing region P1 used for causing the wafer W to adsorb the raw material gas. A region below the reactant gas nozzle 32 is a second processing region P2 supplying a reactant gas that can produce a reaction product by reacting with the raw material gas having been adsorbed in the wafer W in the first processing region P1, to form a molecular layer of the reaction product. The molecular layer of the reaction product constitutes a thin film to be deposited. If necessary, the supply of the reactant gas in the second processing region P2 is also carried out at an early stage when the wafer W is placed on the rotary table 2 and the raw material gas has not yet been supplied to the wafer W. For example, in a case in which a nitride gas such as ammonia is used as the reactant gas, the surface of the wafer W will be nitrided prior to the supply of the raw material gas. This nitriding is to form adsorption sites of the raw material gas on the surface of the wafer W, which may be performed as needed. A region below the reactant gas nozzle 33 is a third processing region P3, in which adsorption inhibiting radicals are supplied to the reaction product or the adsorption sites generated in the second processing region P2, and in which an adsorption inhibiting region is formed on the surface of the wafer W. Because the first processing region P1 is a region supplying the raw material gas, the first processing region P1 may be referred to as a raw material gas supply region P1. Similarly, because the second processing region P2 is a region supplying the reactant gas capable of producing the reaction product by reacting with the raw material gas, the second processing region P2 may be referred to as a reactant gas supply region P2. Also, because the third processing region P3 is a region supplying adsorption inhibiting radicals, the third processing region P3 may be referred to as an adsorption inhibiting radical supply region P3.

In accordance with types of thin films to be deposited, various types of gases, such as silicon-containing gases, metal-containing gases, and the like, can be used as the raw material gas. Also, with respect to the reactant gas, various types of gases may be used in accordance with types of thin films to be deposited as long as the gas is capable of reacting with the raw material gas to produce a reaction product. For example, in a case in which an oxide film is formed, an oxide gas such as oxygen can be used, and in a case in which a nitride film is formed, a nitride gas such as ammonia can be used. In addition, various types of gases may be used as the adsorption inhibiting gas in accordance with types of thin films as long as the gas is an adsorption inhibiting radical capable of suppressing adsorption of the raw material gas through activation by a plasma or the like.

However, in the following embodiment, for the sake of ease of explanation, an example of using gas containing silicon and chlorine as the raw material gas, a nitride gas as the reactant gas, and a chlorine gas as the adsorption inhibiting gas is described. When chlorine is used as the adsorption inhibiting gas, the adsorption inhibiting radicals will be chlorine radicals. However, as described above, the raw material gas, the reactant gas, and the adsorption inhibiting gas are not limited thereto.

A plasma generator 90 is provided near the third processing region P3, such as above or on a side of the third processing region P3. In addition, a plasma generator 80 is provided above the second processing region P2. In FIG. 3, plasma generators 80 and 90 are illustrated in simplified forms, with dashed lines. The plasma generator 90 includes a remote plasma generator for producing chlorine radicals. The plasma generator 80 may include, for example, an ICP (Inductively Coupled Plasma) plasma generator, although types of plasma generators are not limited to a specific type. Details of the plasma generators 80 and 90 will be described below.

As described above, a case in which gas containing silicon and chlorine is used as the raw material gas will be described. For example, when a silicon nitride (SiN) film is formed, a gas containing silicon and chlorine such as dichlorosilane (DCS, $SiH_2Cl_2$) is selected. Various types of gases may be used as the raw material gas if the gas contains silicon and chlorine. For example, in addition to dichlorosilane, a chlorosilane-based gas such as monochlorosilane ($SiH_3Cl$), trichlorosilane ($SiHCl_3$), and hexachlorodisilane ($Si_2Cl_6$) may be used in accordance with the application. DCS is an example of such gases containing silicon and chlorine.

Generally, gas containing ammonia ($NH_3$) is selected as the nitride gas. Further, in a case in which the nitride gas is supplied after being activated by a plasma, nitrogen ($N_2$) containing gas may be selected. The nitride gas may include a carrier gas such as Ar, in addition to ammonia.

The chlorine radicals supplied from the third reactant gas nozzle 33 have a role of dispersively forming adsorption inhibiting regions having discontinuities on a surface of a wafer W, which avoid adsorption of the raw material gas supplied from the first reactant gas nozzle 31 to the wafer W. In the deposition apparatus and the deposition method according to the present embodiment, by forming adsorption inhibiting regions in a distributed manner, a raw material gas is controlled such that the raw material gas is not adsorbed onto an entire surface of the wafer W and is adsorbed locally and in a distributed manner. Details of the deposition method according to the present embodiment will be described below. Also, in FIGS. 2 and 3, although the third reactant gas nozzle 33 is illustrated as a nozzle extending horizontally, the third reactant gas nozzle 33 may be configured as a showerhead. In FIGS. 2 and 3, an example in which the third reactant gas nozzle 33 is configured as a nozzle extending horizontally will be described, and the case in which the nozzle is configured as a showerhead will be described below.

Referring to FIGS. 2 and 3, two projections 4 are provided in the vacuum vessel 1. As described below, the projections 4 are attached to the bottom surface of the top plate 11 such that the projections 4 protrude toward the rotary table 2, in order to configure separation regions D with the separation gas nozzles 41 and 42. Each of the projections 4 also has a fan-like planar shape, the narrowest part of which is cut in an arc. In the present embodiment, an inner circular arc of each of the projections 4 is connected to a protruding portion 5 (to be described below), and an outer circular arc of each of the projections 4 is arranged along the inner circumferential surface of the vessel body 12 of the vacuum vessel 1.

Figure 4:
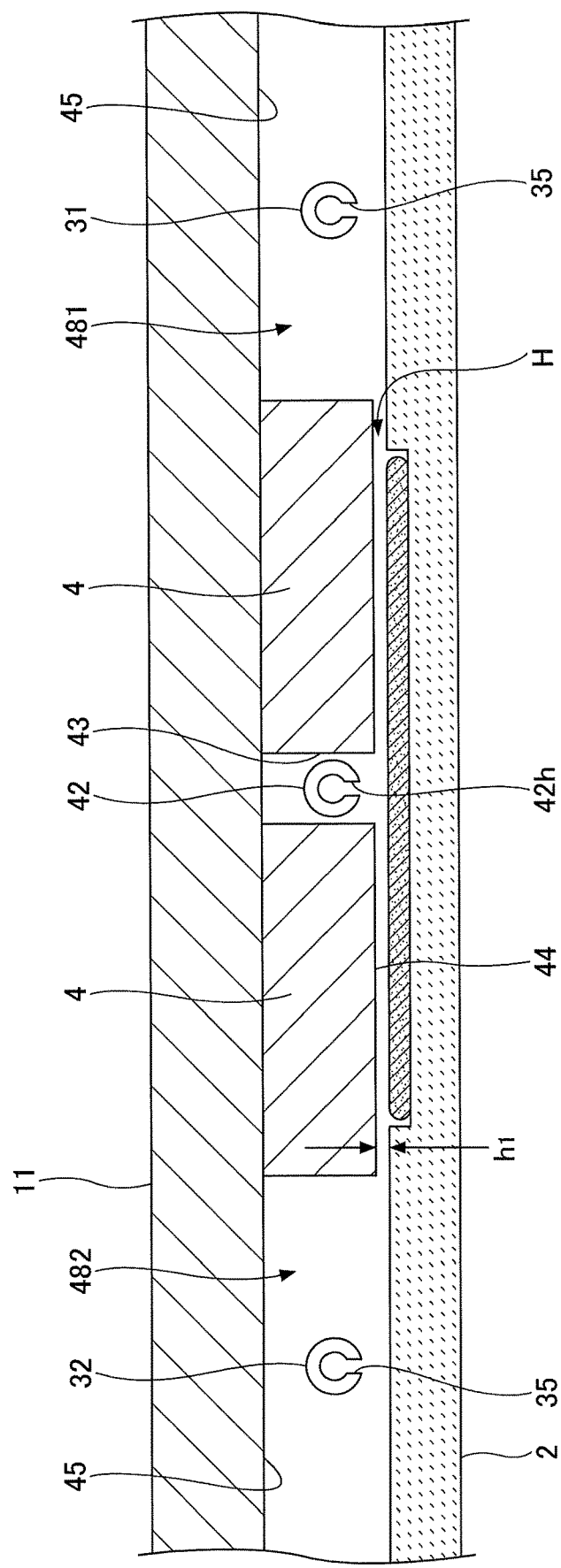
FIG. 4 is a schematic cross-sectional view of the vacuum vessel taken along a concentric circle of a rotary table of the deposition apparatus.

FIG. 4 illustrates a cross-section of the vacuum vessel 1 taken along a concentric circle of the rotary table 2, from the reactant gas nozzle 31 to the reactant gas nozzle 32. As illustrated, because the projection 4 is attached to the bottom surface of the top plate 11, a flat and low ceiling surface 44 (first ceiling surface), which is a bottom surface of the projection 4, and ceiling surfaces 45 (second ceiling surface) that are higher than the ceiling surface 44 are formed in the vacuum vessel 1. The ceiling surfaces 45 are each located on both sides of the ceiling surface 44 in the circumferential direction. The ceiling surface 44 has a fan-like flat shape, the narrowest part of which is cut in an arc. Also, as illustrated, at the center of the projection 4 in the circumferential direction, a groove 43 that extends radially is formed, and the separation gas nozzle 42 is housed in the groove 43. The groove 43 is also formed on the other projection 4, in which the separation gas nozzle 41 is housed. Also, the reactant gas nozzles 31 and 32 are provided in the spaces below the high ceiling surfaces 45, respectively. The reactant gas nozzles 31 and 32 are located in a vicinity of the wafer W, which are spaced from the ceiling surfaces 45. As illustrated in FIG. 4, the reactant gas nozzle 31 is provided in a space 481 below the high ceiling surface 45 at a right side, and a reactant gas nozzle 32 is provided in a space 482 below the high ceiling surface 45 on the left side.

Also, on the separation gas nozzles 41 and 42 each of which is housed in the groove 43 of the corresponding projection 4, multiple gas discharge holes 42h (see FIG. 4) opening toward the rotary table 2 are arranged along a longitudinal direction of the separation gas nozzles 41 and 42 at intervals, for example, of 10 mm.

The ceiling surface 44 forms a separation space H, which is a narrow space, above the rotary table 2. When Ar gas is supplied from the gas discharge holes 42h of the separation gas nozzle 42, the Ar gas flows toward the space 481 and the space 482 through the separation space H. Because a volume of the separation space H is smaller than that of the spaces 481 and 482, when Ar gas flows, a pressure in the separation space H can become higher than that in the spaces 481 and 482. That is, a high pressure separation space (separation space H) is formed between the spaces 481 and 482. Also, the Ar gas flowing from the separation space H into the spaces 481 and 482 functions as a counterflow against the first reactant gas from the first processing region P1 and the second reactant gas from the second processing region P2. Therefore, the raw material gas from the first processing region P1 and the reactant gas from the second processing region P2 are separated by the separation space H.

Accordingly, occurrence of mixing and reaction of the raw material gas and the reactant gas in the vacuum vessel 1 is suppressed.

It is preferable that a height h1 of the ceiling surface 44 from the upper surface of the rotary table 2 is set to a height suitable for raising the pressure in the separation space H relative to the pressures in the spaces 481 and 482, considering the pressure in the vacuum vessel 1 during deposition, rotational speed of the rotary table 2, supply amount of the separation gas (Ar gas), and the like.

On the bottom surface of the top plate 11, the protruding portion 5 (FIGS. 2 and 3) is provided so as to surround an outer circumference of the core 21 that fixes the rotary table 2. In the present embodiment, the protruding portion 5 is continuous with a portion of the projection 4 at a side of a rotational center, and a bottom surface of the protruding portion 5 is formed at the same height as the ceiling surface 44.

Figure 5:
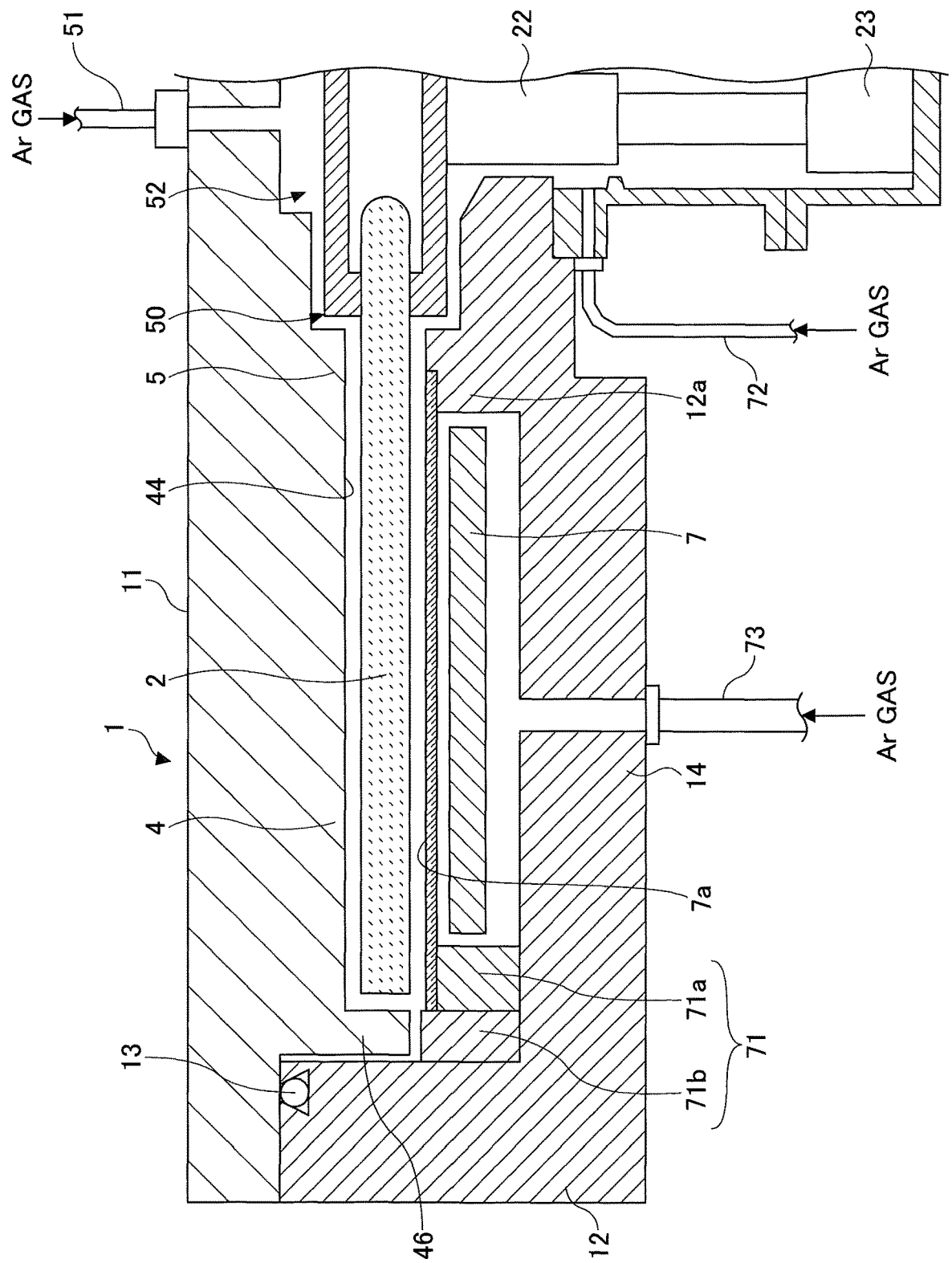
FIG. 5 is another schematic cross-sectional view of the deposition apparatus.

FIG. 1, which has been referred to above, is a cross-sectional view taken along line I-I' in FIG. 3, and FIG. 1 illustrates an area having the ceiling surface 45. In contrast, FIG. 5 is a cross-sectional view illustrating an area in which the ceiling surface 44 is provided. As illustrated in FIG. 5, at a periphery of the fan-shaped projection 4 (the side towards the outside of the vacuum vessel 1) an L-shaped bent portion 46 is formed such that the bent portion 46 faces an outer edge of the rotary table 2. The bent portion 46, similar to the projection 4, prevents the reactant gas from entering the separation region D from both sides, and thereby prevents both of the gases being mixed. Because the fan-shaped projection 4 is provided on the top plate 11 and the top plate 11 is detachable from the vessel body 12, there is a slight gap between an outer circumferential surface of the bent portion 46 and the vessel body 12. A gap between an inner circumferential surface of the bent portion 46 and the outer edge of the rotary table 2, and the gap between the outer circumferential surface of the bent portion 46 and the vessel body 12 are set, for example, to a size similar to the height of the ceiling surface 44 from the upper surface of the rotary table 2.

In the separation region D, an inner circumferential wall of the vessel body 12 is formed to be straight in a vertical direction and is close to the outer circumferential surface of the bent portion 46, as illustrated in FIG. 5. With respect to a portion other than the separation region D, as illustrated in FIG. 1, for example, the inner circumferential wall of the vessel body 12 is recessed outwardly from a portion facing the outer edge of the rotary table 2 toward the bottom portion 14. For the sake of description, the recessed portion having a substantially rectangular cross-sectional shape is hereinafter referred to as an exhaust region. Specifically, the exhaust region in communication with the first processing region P1 is referred to as a first exhaust region E1, and the region in communication with the second and third processing regions P2 and P3 are referred to as a second exhaust region E2. At bottoms of these first and second exhaust regions E1 and E2, a first exhaust port 610 and a second exhaust port 620 are formed respectively, as illustrated in FIGS. 1-3. Each of the first exhaust port 610 and the second exhaust port 620 is connected to a vacuum exhaust means such as a vacuum pump 640 via an exhaust pipe 630, as illustrated in FIG. 1. Further, a pressure controller 650 is provided between the vacuum pump 640 and the exhaust pipe 630.

As illustrated in FIGS. 2 and 3, although a separation region H is not provided between the second processing region P2 and the third processing region P3, in FIG. 3, equipment for partitioning the space over the rotary table 2 is provided at each of the regions illustrated as a plasma generator 80 and a plasma generator 90. Thus, the space in the second processing region P2 is separated from the space in the third processing region P3. Details of this point will be described below.

In a space between the rotary table 2 and the bottom portion 14 of the vacuum vessel 1, a heater unit 7 which is a heating means is provided, as illustrated in FIGS. 1 and 5. The wafer W on the rotary table 2 is heated to a temperature (e.g., 400° C.) determined by a process recipe, via the rotary table 2. A ring-shaped cover member 71 is provided below the rotary table 2 near the circumference of the rotary table 2 such that an atmosphere extending from a space above the rotary table 2 to the exhaust regions E1 and E2 is separate from an atmosphere in which the heater unit 7 is placed, to prevent gas from entering an area below the rotary table 2 (FIG. 5). The cover member 71 includes an inner member 71a disposed at an area under the outer edge of the rotary table 2 and under a periphery of the outer edge of the rotary table 2, and an outer member 71b disposed between the inner member 71a and the inner wall surface of the vacuum vessel 1. The outer member 71b is provided, below the bent portion 46 formed at the outer edge of the projection 4 in the separation region D, in proximity to the bent portion 46, and the inner member 71a surrounds the heater unit 7 throughout its entire circumference under the outer edge of the rotary table 2 (and just outside of the outer edge).

A portion of the bottom portion 14 closer to the rotational center relative to the space accommodating the heater unit 7 extends upwardly toward a portion of the core 21 near the center of the bottom surface of the rotary table 2, to form an extending portion 12a. The space between the extending portion 12a and the core 21 is narrow, and the gap between the rotating shaft 22 passing through the bottom portion 14 and an inner peripheral surface of a through-hole of the rotating shaft 22 is also narrow. These narrow spaces communicate with the casing 20. The casing 20 is provided with a purge gas supply line 72 for supplying Ar gas serving as a purge gas to purge from the narrow spaces. Also, at the bottom portion 14 of the vacuum vessel 1, multiple purge gas supply lines 73 are provided at predetermined angular intervals below the heater unit 7, in order to purge from the space accommodating the heater unit 7 (one of the purge gas supply lines 73 is illustrated in FIG. 5). In addition, a lid member 7a is provided between the heater unit 7 and the rotary table 2 such that the lid member 7a circumferentially covers an area from the inner peripheral wall (the upper surface of the inner member 71a) of the outer member 71b to an upper end portion of the extending portion 12a, in order to prevent gas from entering the region accommodating the heater unit 7. The lid member 7a may be made of, for example, quartz.

A separation gas supply line 51 is connected to the center of the top plate 11 of the vacuum vessel 1, and is configured to supply Ar gas serving as a separation gas to a space 52 between the top plate 11 and the core 21. The separation gas supplied to the space 52 is discharged toward the periphery of the rotary table 2 along the surface of the rotary table 2 at a side on which a wafer is placed, through a narrow gap 50 between the protruding portion 5 and the rotary table 2. The gap 50 may be maintained at higher pressure than the space 481 and the space 482 by the separation gas. Accordingly, the gap 50 inhibits the raw material gas supplied to the first processing region P1 and the nitride gas supplied to the second processing region P2 from being mixed through a central region C. That is, the gap 50 (or the central region C) can function similarly to the separation space H (or the separation region D).

Further, as illustrated in FIGS. 2 and 3, the conveying port 15 is provided at the side walls of the vacuum vessel, which is used for passing a wafer W (substrate) between the rotary table 2 and a conveying arm 10 located outside. The conveying port 15 is opened and closed by a gate valve (not illustrated). When the recess 24 on the rotary table 2, which is an area for placing the wafer, is positioned at a location facing the conveying port (this location may be referred to as a "delivery position"), the wafer W is passed between the rotary table 2 and the conveying arm 10. Thus, the lift pins for lifting the wafer W from its bottom by passing through the recess 24, and a lifting mechanism for the lift pins, are provided at a location corresponding to the delivery position below the rotary table 2 (neither the lift pins nor the lifting mechanism are illustrated in the drawings).

Figure 6:
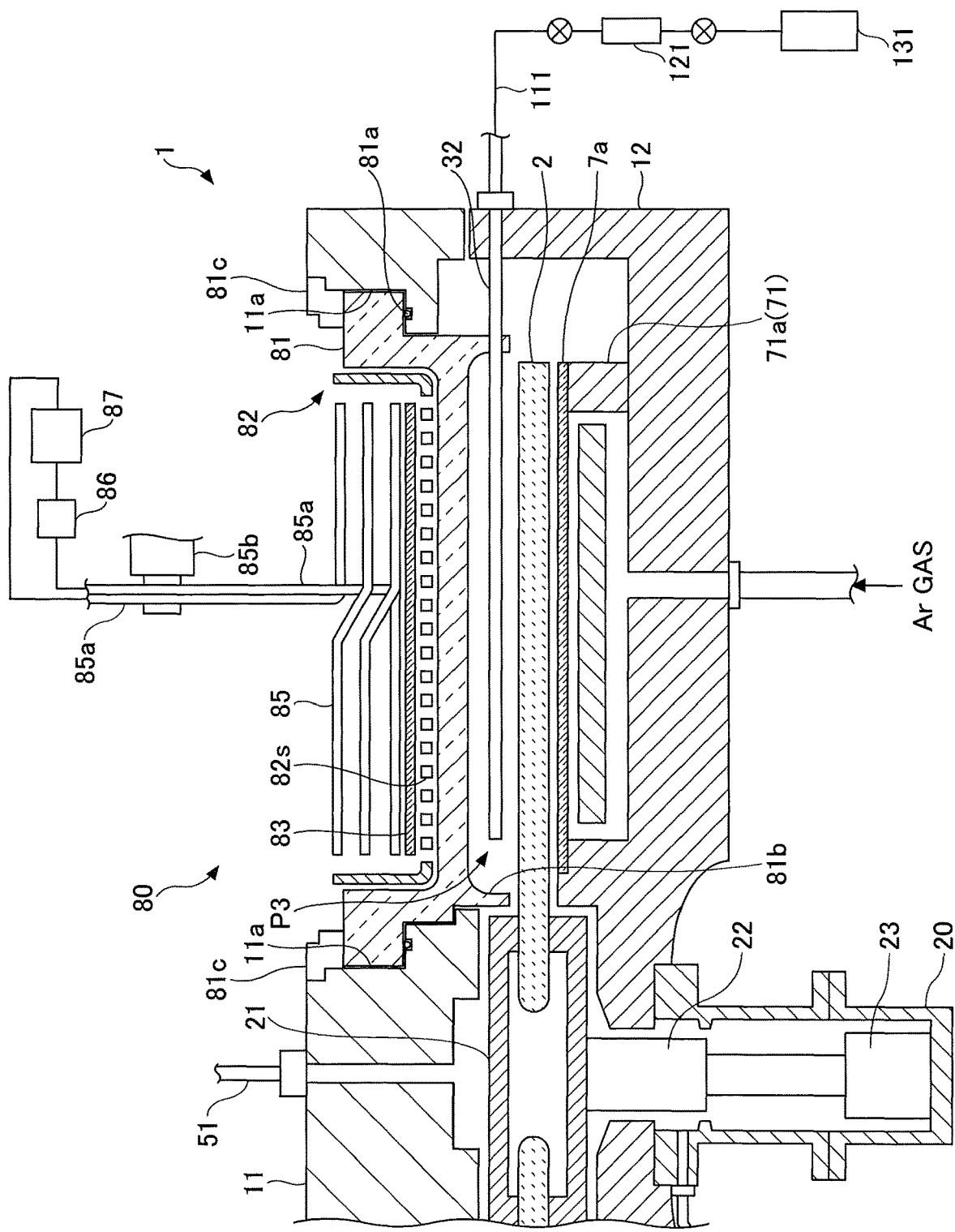
FIG. 6 is a schematic cross-sectional view illustrating a plasma generator provided in the deposition apparatus.
Figure 7:
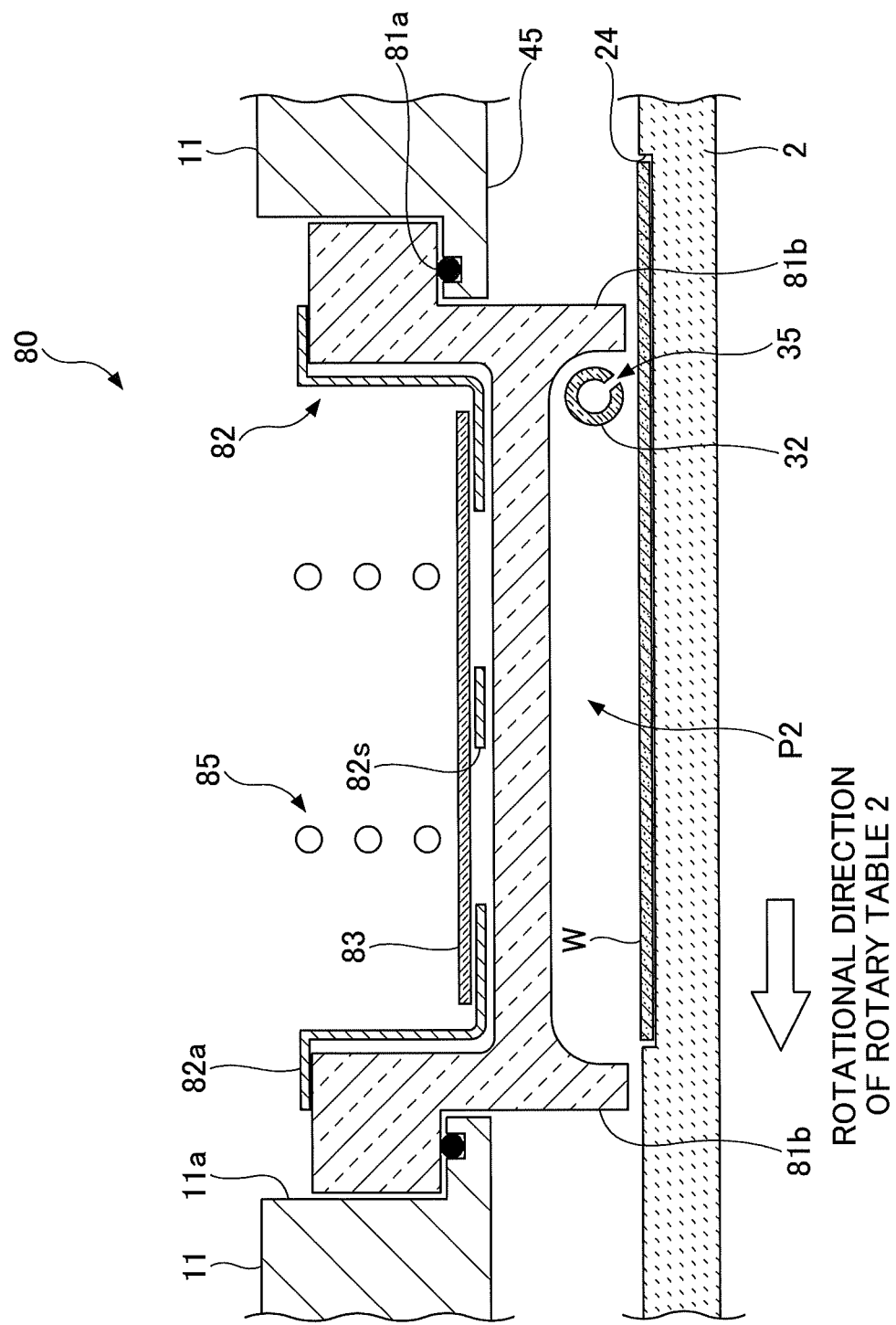
FIG. 7 is another schematic cross-sectional view of the plasma generator provided in the deposition apparatus.
Figure 8:
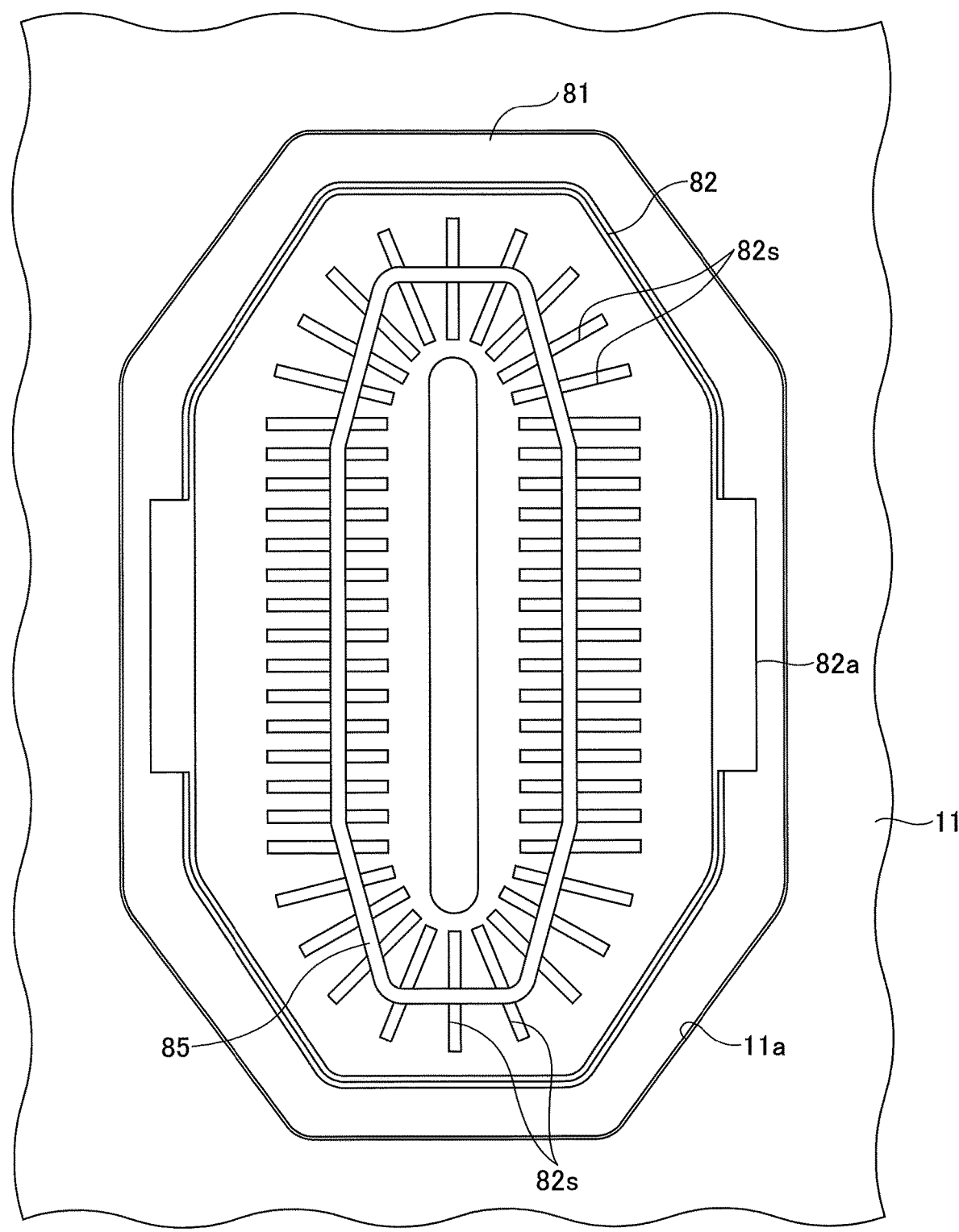
FIG. 8 is a schematic top view illustrating the plasma generator provided in the deposition apparatus.

Next, the plasma generator 80 will be described with reference to FIGS. 6 to 8. FIG. 6 is a schematic cross-sectional view of the plasma generator 80 along a radial direction of the rotary table 2, FIG. 7 is a schematic cross-sectional view of the plasma generator 80 along a direction perpendicular to the radial direction of the rotary table 2, and FIG. 8 is a top view schematically illustrating the plasma generator 80. For the convenience of illustration, some members are simplified in these drawings.

Referring to FIG. 6, the plasma generator 80 includes a frame member 81 made from material allowing passage of high frequency electricity, a Faraday shield plate 82 of a substantially box-like shape, an insulating plate 83 disposed on the bottom surface of the Faraday shield plate 82, and a coiled antenna 85 that is supported above the insulating plate 83 and has a substantially octagonal shape in a plan view. The frame member 81 has a recess on its top surface, and is fitted into an opening 11a formed on the top plate 11. The Faraday shield plate 82 is housed in the recess of the frame member 81, and an upper surface of the Faraday shield plate 82 is opened.

The opening 11a of the top plate 11 has multiple steps, one step of which is formed with a groove around the entire circumference, and the groove is fitted with a sealing member 81a such as an O-ring. The frame member 81 has multiple steps corresponding to the steps of the opening 11a. When the frame member 81 is fitted into the opening 11a, a bottom surface of one of the steps of the frame member 81 contacts the sealing member 81a fitted into the groove of the opening 11a, thereby maintaining airtightness between the top plate 11 and the frame member 81. Further, as illustrated in FIG. 6, a pressing member 81c is provided along the outer periphery of the frame member 81 fitted into the opening 11a of the top plate 11, whereby the frame member 81 is pressed downward against the top plate 11. Therefore, the airtightness between the top plate 11 and the frame member 81 is more securely maintained.

A bottom surface of the frame member 81 faces the rotary table 2 in the vacuum vessel 1, and an outer periphery of the bottom surface of the frame member 81 is provided with a protruding portion 81b that protrudes downwardly (towards the rotary table 2) throughout an entire circumference of the bottom surface of the frame member 81. The lower surface of the protruding portion 81b is proximate to the surface of the rotary table 2, and a space (hereinafter referred to as a second processing region P2) is defined above the rotary table 2 by the protruding portion 81b, the surface of the rotary table 2, and the bottom surface of the frame member 81. The distance between the lower surface of the protruding portion 81b and the surface of the rotary table 2 may be approximately the same as the height h1 of the ceiling surface 44 from the upper surface of the rotary table 2 in the separation space H (FIG. 4).

Further, the reactant gas nozzle 32 extends into the second processing region P2, by penetrating the protruding portion 81b. In the present embodiment, as illustrated in FIG. 6, a nitride gas supply 131 filled with nitride gas is connected with the reactant gas nozzle 32 via a pipe 111, while interposing the flow controller 121 between the nitride gas supply 131 and the pipe 111. The nitride gas may be, for example, a gas containing ammonia (NH$_3$). In particular, the nitride gas may be a mixture of ammonia (NH$_3$) and argon (Ar). A nitride gas whose flow rate is controlled by the flow controller 121 is activated by the plasma generator 80 and supplied to the second processing region P2 at a predetermined flow rate. In a case in which a mixture of ammonia and argon is used as the nitride gas, ammonia and argon may be supplied separately. However, FIG. 6 illustrates a case in which a mixture of ammonia and argon is supplied to the reactant gas nozzle 32, for convenience of description.

The multiple discharge holes 35 are formed on the reactant gas nozzle 32 at predetermined intervals (e.g., 10 mm) along the longitudinal direction of the reactant gas nozzle 32, and the above-described nitride gas is discharged from the discharge holes 35. As illustrated in FIG. 7, the discharge holes 35 are inclined from a direction perpendicular to the rotary table 2 toward an upstream side of the rotating direction of the rotary table 2. Accordingly, the gas supplied from the reactant gas nozzle 32 is discharged toward an opposite direction with respect to the rotating direction of the rotary table 2. Specifically, the gas is discharged toward a gap between the lower surface of the protruding portion 81b and the surface of the rotary table 2. This prevents raw material gas or separation gas from flowing into the second processing region P2 from the space under the ceiling surface 45 located at an upstream side of the plasma generator 80 along the rotating direction of the rotary table 2. Further, as described above, because the protruding portion 81b formed along the outer periphery of the bottom surface of the frame member 81 is proximate to the surface of the rotary table 2, the second processing region P2 can be easily maintained at high pressure by the gas supplied from the reactant gas nozzle 32. This also prevents raw material gas or separation gas from flowing into the second processing region P2.

As described above, the frame member 81 serves to separate the second processing region P2 from its surroundings. Accordingly, the deposition apparatus according to the embodiment of the present invention includes the frame member 81 for forming a boundary of the second processing region P2, in addition to the plasma generator 80.

The Faraday shield plate 82 is made from conductive material such as metal, and is grounded, although not illustrated. As clearly illustrated in FIG. 8, multiple slits 82s are formed at the bottom of the Faraday shield plate 82. Each of the slits 82s extends to a direction approximately perpendicular to a corresponding edge of the antenna 85 having a substantially octagonal planar shape.

The Faraday shield plate 82 has a support portion 82a that bends outwardly at two points on the upper end, as illustrated in FIGS. 7 and 8. As the support portion 82a is supported on the top surface of the frame member 81, the Faraday shield plate 82 is supported at a predetermined position in the frame member 81.

The insulating plate 83 is made of quartz glass, for example. The insulating plate 83 is slightly smaller than the bottom surface of the Faraday shield plate 82, and is placed on the bottom surface of the Faraday shield plate 82. By the insulating plate 83, the Faraday shield plate 82 and the antenna 85 are electrically insulated, while high frequency power emitted from the antenna 85 passes downward.

The antenna 85 is formed by three windings of a copper hollow tube (pipe), for example, such that a planar shape is substantially octagonal. As cooling water can circulate in the pipe, the antenna 85 can be prevented from being heated to high temperature by high frequency power supplied to the antenna 85. In addition, the antenna 85 includes a vertical portion 85a, and the vertical portion 85a is mounted to a support member 85b. By the support member 85b, the antenna 85 is fixed at a predetermined position in the Faraday shield plate 82. Also, a high frequency power supply 87 is connected to the vertical portion 85a via a matching box 86. The high frequency power supply 87 can generate high frequency electric power of, for example, 13.56 MHz.

According to the plasma generator 80 configured as described above, an electromagnetic field is generated by the antenna 85 when high frequency power is supplied from the high frequency power supply 87 to the antenna 85 via a matching box 86. An electric field component of the electromagnetic field is shielded by the Faraday shield plate 82 and cannot be propagated downward. On the other hand, a magnetic field component passes through the multiple slits 82s of the Faraday shield plate 82, and is propagated into the third processing region P3. The magnetic field component activates the nitride gas supplied from the reactant gas nozzle 33 to the second processing region P2 at a predetermined flow rate.

Next, the plasma generator 90 of the deposition apparatus according to the present embodiment will be described.

Figure 9:
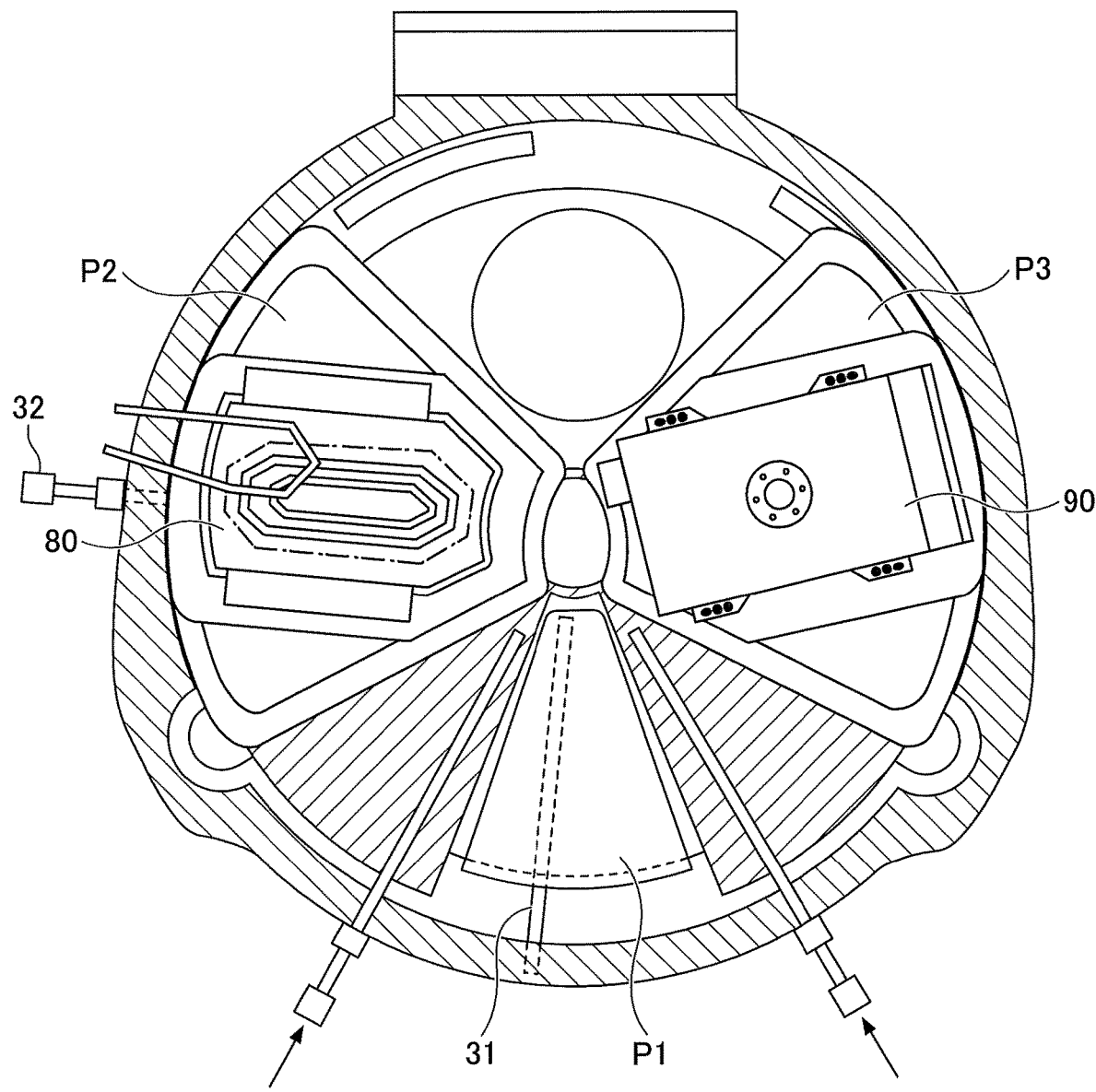
FIG. 9 is a schematic plan view illustrating an example of the deposition apparatus.

FIG. 9 is a top view of the deposition apparatus according to the embodiment of the present invention, which is equipped with the plasma generators 80 and 90. The plasma generator 90 is configured as a remote plasma generator.

An inductively coupled plasma generator (ICP) 80 utilizing the antenna 85 described with reference to FIGS. 6 to 8 is effective in generating a plasma with high plasma intensity, and can function effectively if both ionized nitride gas and radicalized nitride gas may be generated. However, if chloride ions are not required and only chlorine radicals are required, a remote plasma generator is preferred. That is, because the remote plasma generator activates chlorine by plasma at an outside of the vacuum vessel 1, the shorter-lived ionized chlorine will be inactive in the vacuum vessel 1 or before reaching a wafer W, and only the longer-lived radicalized chlorine will be supplied to the wafer W. Accordingly, activated chlorine gas, which contains much more chlorine radicals weakly activated than that activated by the ICP plasma generator generating a plasma directly in the vacuum vessel 1, can be supplied to the wafer W. The plasma generator 90 according to the present embodiment employs a plasma generator capable of supplying chlorine radicals to the wafer W, with little ionized chlorine supplied. An example of such a plasma generator is a remote plasma generator. However, the plasma generator 90 is not limited to a remote plasma generator, and various plasma generators can be used if chlorine radicals can be generated primarily without producing too many chloride ions.

Figure 10:
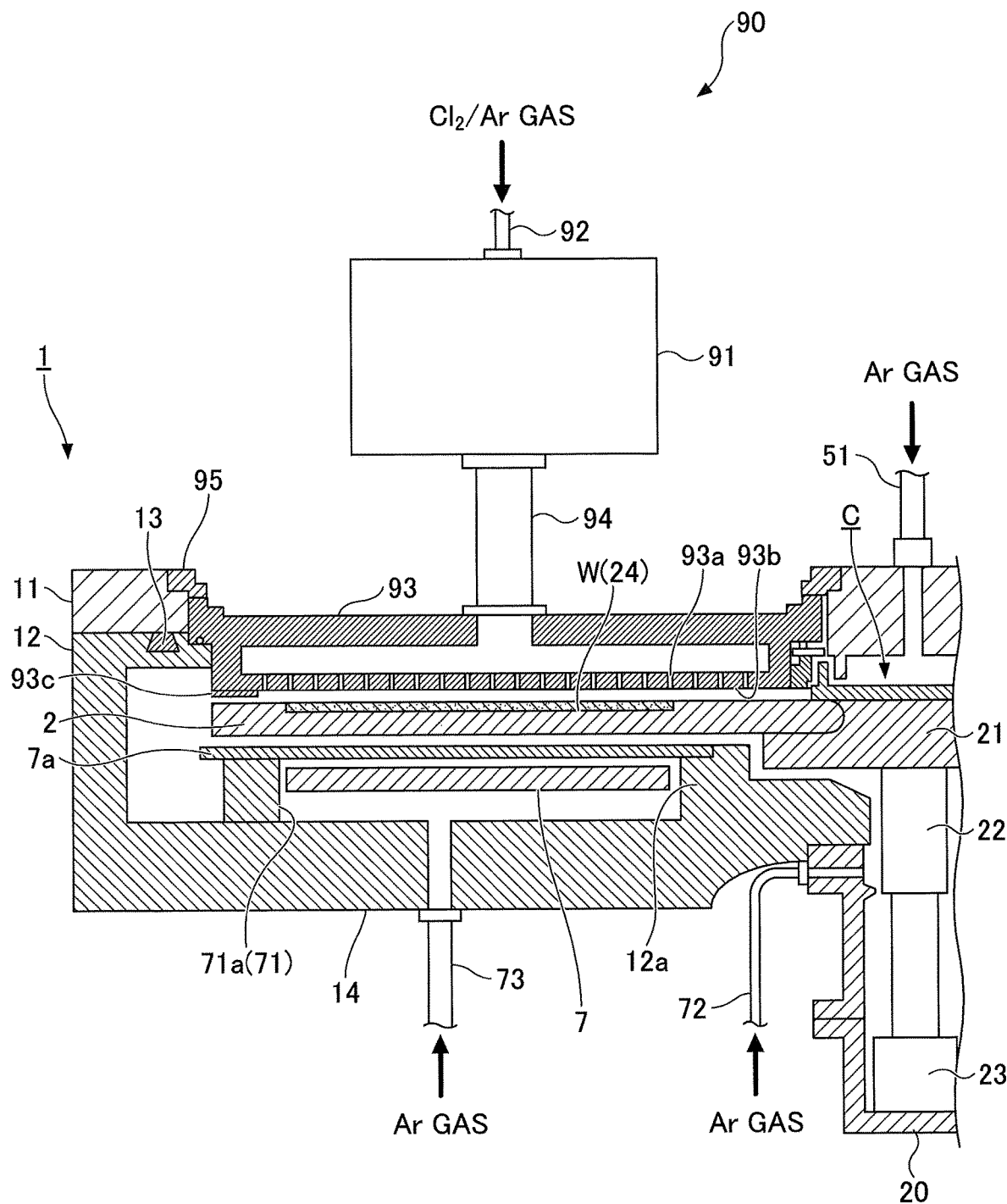
FIG. 10 is a partial cross-sectional view illustrating a third processing region in the deposition apparatus.

FIG. 10 is a cross-sectional view of the deposition apparatus according to the present embodiment, which includes the plasma generator 90.

As illustrated in FIG. 10, the plasma generator 90 is disposed in the third processing region P3 so as to face the rotary table 2. The plasma generator 90 includes a plasma generating section 91, a gas supply line 92, a showerhead 93, and a pipe 94. The showerhead 93 is an example of a chlorine gas discharging section. For example, a gas nozzle may be used instead of the showerhead 93.

The plasma generating section 91 activates chlorine gas supplied from the gas supply line 92 by a plasma source. The plasma source is not particularly limited as long as the plasma source is able to radicalize chlorine gas. For example, an inductively coupled plasma (ICP), a capacitively coupled plasma (CCP), or a surface wave plasma (SWP) can be used as the plasma source.

One end of the gas supply line 92 is connected to the plasma generating section 91 to supply chlorine gas to the plasma generating section 91. The other end of the gas supply line 92 is connected to a chlorine gas source 132 storing chlorine gas, via an open/close valve and a flow regulator, for example.

The showerhead 93 is connected to the plasma generating section 91 via the pipe 94, and supplies fluorine-containing gas activated by the plasma generating section 91 to the vacuum vessel 1. The showerhead 93 has a fan-like planar shape, and is pressed downwardly and circumferentially by a pressing member 95 formed along an outer periphery of the fan-like planar shape. Further, since the pressing member 95 is fixed to the top plate 11 by bolts or the like which is not illustrated, an inside of the vacuum vessel 1 is made to be an airtight state. The distance between a lower surface of the showerhead 93 when fixed to the top plate 11 and the upper surface of the rotary table 2 may be, for example, from 0.5 mm to 5 mm.

Multiple gas discharge holes 93a are provided on the showerhead 93 such that a smaller number of the gas discharge holes 93a are provided at a side closer to the rotational center and a larger number of the gas discharge holes 93a are provided at a side closer to a periphery, to accommodate velocity difference of the rotary table 2 at each location. The number of the multiple gas discharge holes 93a may be, for example, tens to hundreds. A diameter of each of the gas discharge holes 93a may be, for example, from 0.5 mm to 3 mm. The activated chlorine gas supplied to the showerhead 93 is supplied to a space between the rotary table 2 and the showerhead 93 through the gas discharge holes 93a.

Figure 11:
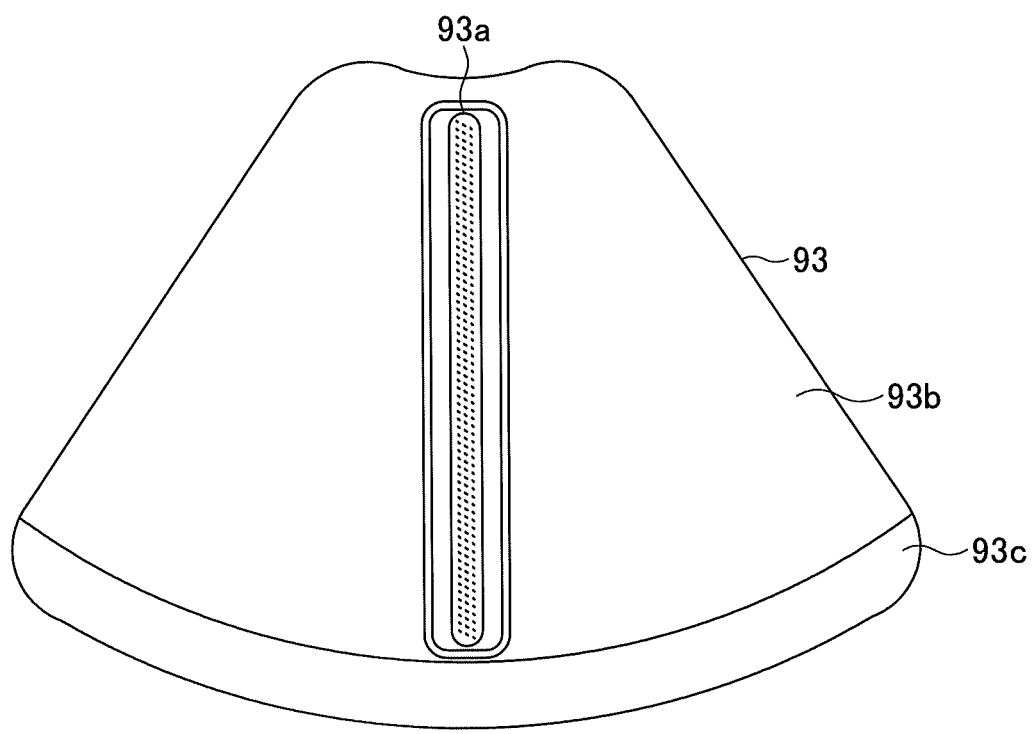
FIG. 11 is a plan view illustrating an example of a bottom surface of a showerhead.

FIG. 11 is a plan view illustrating an example of a lower surface of the showerhead 93. As illustrated in FIG. 11, a downwardly projecting surface 93c may be provided in a form of a strip, along an outer periphery of the lower surface 93b of the fan-shaped showerhead 93. Accordingly, pressure decrease at the outer circumferential side of the third processing region P3 can be avoided uniformly in the circumferential direction. Also, the gas discharge holes 93a may be provided in a center portion of the lower surface 93b of the showerhead 93 so as to extend radially. Thus, chlorine gas supplied to the rotary table 2 can be dispersed from a center side to an outer circumferential side of the rotary table 2.

Chlorine radicals may be supplied to a wafer W as described above, by using the plasma generator 90 configured as a remote plasma generator.

A remote plasma generator is not limited to a structure having the showerhead 93 as illustrated in FIGS. 9 to 11. A remote plasma generator may employ the reactant gas nozzle 33 as illustrated in FIGS. 2 and 3. In this case, for example, the plasma generating section 91 may be provided at an outer side surface of the vessel body 12, and may be configured to supply chlorine radicals from the outer side surface to the reactant gas nozzle 33.

Further, as illustrated in FIG. 1, the deposition apparatus according to the present embodiment includes a controller 100 having a computer for controlling an entire operation of the apparatus. In a memory of the controller 100, a program that causes the deposition apparatus to perform a deposition method to be described below under control of the controller 100 is stored. The program includes multiple steps for executing the deposition method to be described below. The program is stored in a recording medium 102 such as a hard disk, a compact disk, a magneto-optical disk, a memory card, or a flexible disk, and is read into a storage unit 101 by a predetermined reading device to be installed into the controller 100.

The controller 100 also performs control for performing the deposition method according to the embodiment of the present invention, which will be described below.

[Deposition Method]

Figure 12:
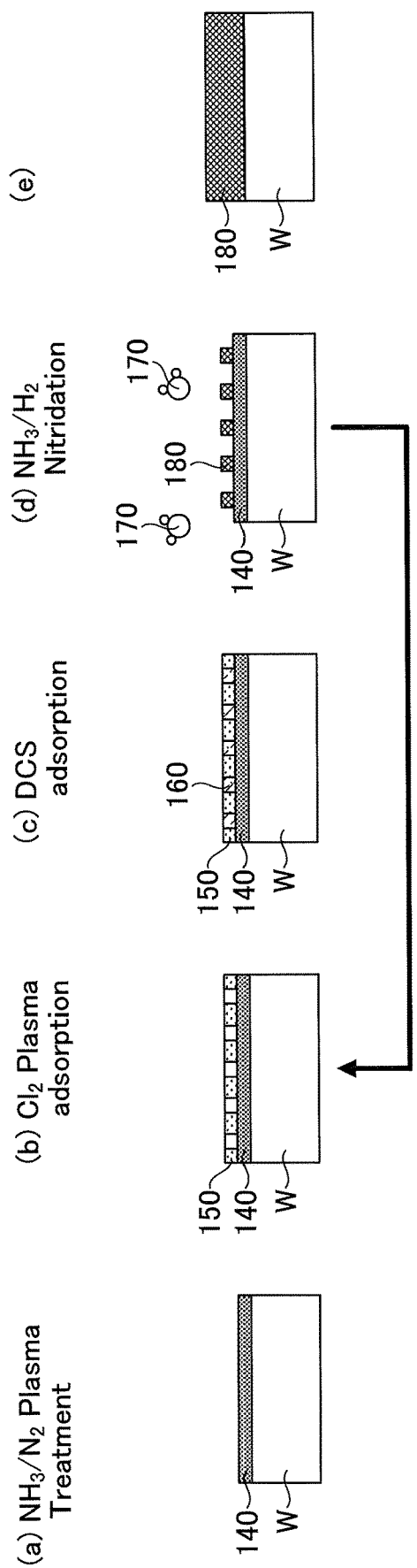
FIG. 12 is a diagram illustrating an example of a series of steps of the deposition method according to the embodiment of the present disclosure.

Next, with reference to FIG. 12, a case for performing the deposition method according to the embodiment of the present invention by using the above-described deposition apparatus will be described. FIG. 12 is a diagram illustrating a series of steps of an example of the deposition method according to the embodiment of the present invention.

The deposition method according to the present embodiment can be applied to a variety of thin films. However, in the present embodiment, for ease of explanation, an example of forming a silicon nitride film using dichlorosilane (DCS, $SiH_2Cl_2$) as the raw material gas, ammonia as the reactant gas, and chlorine radicals as adsorption inhibiting radicals, will be described.

FIG. 12 (a) is a diagram illustrating an example of a plasma-based refining step of the deposition method according to the present embodiment.

In the present embodiment, a silicon wafer is used as the wafer W. In FIG. 12, in order to facilitate understanding, a case in which no recess pattern such as a trench or a via is specifically formed on a surface of the wafer W, and in which a silicon nitride film is deposited on a flat surface of the wafer W, will be described. However, the deposition method according to the present embodiment can be applied similarly, even if a trench, a via, or the like is formed on a surface of a wafer W. Hereinafter, an example of forming a silicon nitride film on a flat surface of the wafer W will be described.

As described above, in the present embodiment, dichlorosilane (DCS, $SiH_2Cl_2$) and nitrogen serving as a carrier gas are supplied from the reactant gas nozzle 31, a mixture of argon and ammonia ($NH_3$) serving as a nitride gas is supplied from the reactant gas nozzle 32, and a mixture of chlorine and argon serving as a chlorine-containing gas is supplied from the showerhead 93. However, because nitrogen serving as a carrier gas of dichlorosilane, and argon supplied with a nitride gas and a chlorine gas are inert gas, and they do not contribute to reaction, no particular reference will be made, with respect to nitrogen and argon, in the following description. Further, the nitride gas and the chlorine-containing gas are supplied after the nitride gas is activated (ionized or radicalized) by an ICP plasma generated in the plasma generator 80 and the chlorine-containing gas is radicalized by a remote plasma generated in the plasma generator 90.

First, in the deposition apparatus described in FIGS. 1 to 11, a gate valve (not illustrated) is opened, and a wafer W is passed from the outside through the conveying port 15 (FIGS. 2 and 3) by using the conveying arm 10 (FIG. 3) into the recess 24 of the rotary table 2. This wafer transfer is accomplished by lifting and lowering the lift pins (not illustrated) from the bottom portion of the vacuum vessel 1 through the through-holes on the bottom surface of the recess 24 when one of the recesses 24 stops at a position facing the conveying port 15. Such transfer of a wafer W is performed by intermittently rotating the rotary table 2 and placing a wafer W in each of the five recesses 24 of the rotary table 2.

Subsequently, the gate valve is closed, and the vacuum vessel 1 is evacuated by the vacuum pump 640 at a reachable quality of vacuum. Then, Ar gas, which is the separation gas, is discharged from the separation gas nozzles 41 and 42 at a predetermined flow rate, and Ar gas is also discharged from the separation gas supply line 51 and the purge gas supply lines 72 and 73 at a predetermined flow rate. Also, the pressure controller 650 (FIG. 1) controls the inside of the vacuum vessel 1 to a preset processing pressure. Next, the wafers W are heated by the heater unit 7 to 400° C. for example, while rotating the rotary table 2 clockwise at a rotational speed of 10 rpm for example. The rotational speed of the rotary table 2 can be set to various values depending on application. The plasma generators 80 and 90 are also activated.

Subsequently, an adsorption site forming step is performed. Specifically, the activated nitride gas is supplied from the reactant gas nozzle 32 (FIGS. 2 and 3) to start plasma-based refinement of surfaces of the wafers W. Thus, the surfaces of the wafers W are refined by being nitrided by plasma, and thereby adsorb $NH_2$ radicals. Because the $NH_2$ radicals function as an adsorption site 140 for the raw material gas containing silicon, the adsorption site 140 for dichlorosilane which is the raw material gas is formed on the surfaces of the wafers W. In the plasma-based refining step performed for the first time, the rotary table 2 is rotated for the predetermined number of times until the surfaces of the wafers W are sufficiently nitrided, and the first plasma-based refining step terminates when the surfaces of the wafers W is refined, and supply of the nitride is suspended. The rotary table 2 continues to rotate while the wafers W are placed.

In a case in which the adsorption site 140 for the raw material gas is already formed on a surface of a wafer W, the adsorption site forming step is not required. Also, even if no particular adsorption site 140 is formed on a surface of a wafer W, the adsorption site forming step may not be performed if the surface of the wafer W can adsorb the raw material gas. Accordingly, the adsorption site forming step may be performed as needed.

In a case in which the adsorption site forming step of FIG. 12 (a) is not performed, it is sufficient to perform the step of FIG. 12 (b) without performing the step of FIG. 12 (a), after supplying the separation gas and rotating the rotary table 2. In a case in which the plasma-based refining step of FIG. 12 (a) is performed for a predetermined period of time, the step of FIG. 12 (b) is started after supply of the nitride gas from the reactant gas nozzle 32 is suspended to stop the plasma-based refinement. That is, the supply of the nitride gas from the reactant gas nozzle 32 is stopped when entering the step of FIG. 12 (b), whether the plasma-based refining step is performed or not.

FIG. 12 (b) is a diagram illustrating an example of an adsorption inhibiting region forming step. In the present embodiment, because the adsorption inhibiting region forming step is a step of causing a surface of a wafer W to adsorb chlorine radicals which are adsorption inhibiting radicals onto the surface of the wafer W, more accurately, a step of causing a surface of the adsorption site 140 to adsorb chlorine radicals, it may be referred to as an adsorption inhibiting radical adsorption step, or more specifically, a chlorine radical adsorption step.

As described above, the adsorption inhibiting region forming step is performed while supply of the activated nitride gas is stopped. In the adsorption inhibiting region forming step, the rotary table 2 is rotated for the predetermined number of times while supplying chlorine radicals from the showerhead 93, to cause the surface of the wafer W to adsorb the chlorine radicals dispersively or such that gaps (discontinuities) in the chlorine radical surface area are present. That is, rather than causing an entire surface of a wafer W to adsorb the chlorine radicals, the chlorine radicals are dispersively adsorbed (such that gaps (discontinuities) in the chlorine radical surface area are present) by a surface of the adsorption site 140 while leaving as is some portion of the adsorption site 140. Thus, $NH_2$ radicals, which are the adsorption site 140, also exist discontinuously or dispersively on the surface of the wafer W. That is, the adsorption site 140 is partially or locally covered with chlorine radicals, but the adsorption site 140 is exposed dispersively or discontinuously because areas that do not adsorb chlorine radicals remain partially or locally.

In the adsorption inhibiting region forming step, argon, which is a separation gas, is supplied from the separation gas nozzles 41 and 42. However, during the adsorption inhibiting region forming step, dichlorosilane, which is the raw material gas, is not supplied from the reactant gas nozzle 31, and ammonia, which is the nitride gas, is not supplied from the reactant gas nozzle 32.

Chlorine radicals inhibit the adsorption of dichlorosilane because chlorine radicals have an adsorption inhibitory effect on chlorine-containing dichlorosilane. In the adsorption inhibiting region forming step, a predetermined amount of adsorption inhibiting radicals having such an adsorption inhibitory effect is adsorbed by a surface of the adsorption site 140 with presence of discontinuities (gaps), so that the adsorption inhibiting region 150 is formed with discontinuities (gaps) on the adsorption site 140. That is, because the chlorine radicals are partially or locally adsorbed by the adsorption site 140 on the surface of the wafer W to cover the adsorption site 140, a state in which the adsorption site 140 is partially or locally exposed is formed.

The formation of such an adsorption inhibiting region 150 having discontinuities (gaps) is accomplished by adjusting a time range of supplying chlorine gas which is an adsorption inhibiting gas, or adjusting a flow rate of the chlorine gas. In the deposition apparatus according to the present embodiment, it is possible to easily adjust a period of time performing the chlorine radical adsorption step by adjusting the number of rotations of the rotary table 2 performed while the chlorine radical adsorption step is continuously performed. That is, if the number of rotations of the rotary table 2 performed while the chlorine radical adsorption step is continuously performed is set high, the adsorption site 140 adsorbs the chlorine radicals in a wide area, and the adsorption inhibiting region is formed over a wide area. If the number of rotations of the rotary table 2 while the chlorine radical adsorption step is continuously performed is reduced, a range of the adsorption site 140 which adsorbs chlorine radicals becomes smaller, and the adsorption site 140 (not having adsorbed chlorine radicals) remains in a wide area. Alternatively, the distribution and size of the adsorption inhibiting region 150 can be adjusted based on a supply rate of chlorine gas, because a larger number of chlorine radicals are adsorbed as an amount of chlorine radicals supplied per unit time increases.

In either case, the adsorption inhibiting region 150 is formed having discontinuities (gaps) or dispersively rather than being formed on an entire surface of the adsorption site 140. By performing the above-described step, an amount of the raw material gas to be adsorbed can be controlled.

The adsorption of chlorine radicals is physisorption, which is based on Coulomb force caused by the high electronegativity of chlorine. Thus, unlike chemical bonds, this attractive force is weak such that an adsorbed object is easily blown off.

FIG. 12 (c) is a diagram illustrating an example of a raw material gas adsorption step. In the raw material gas adsorption step, a raw material gas 160 containing silicon and chlorine is supplied to the surface of the wafer W. That is, dichlorosilane is supplied from the reactant gas nozzle 31. Thus, dichlorosilane, which is the raw material gas 160, is adsorbed by the surface of the adsorption site 140 on the wafer W. Because the adsorption inhibiting region 150 is discontinuously formed, the dichlorosilane which is the raw material gas 160 is adsorbed by the discontinuously exposed adsorption site 140 on which the adsorption inhibiting region 150 is not formed.

As described above, an amount of raw material gas to be adsorbed can be controlled by controlling an amount of the adsorption inhibiting region 150 (amount of adsorption inhibiting radicals adsorbed).

FIG. 12 (d) is a diagram illustrating an example of a reaction product deposition step. In the reaction product deposition step, a reactant gas 170 is supplied to the surface of the wafer W on which a predetermined amount of raw material gas is discontinuously adsorbed, and a reaction product 180 of the raw material gas 160 and the reactant gas 170 is deposited on the surface of the wafer W. In the present embodiment, ammonia as a nitride gas is supplied to the surface of the wafer W on which dichlorosilane is dispersively adsorbed, and a silicon nitride is deposited on the wafer W as the reaction product 180, to form a silicon nitride film. Accordingly, in the present embodiment, the reaction product deposition step may be referred to as a nitriding step. More specifically, a nitride gas (ammonia) is supplied from the reactant gas nozzle 32 and ammonia activated by the plasma generator 80 is supplied to the surface of the wafer W. The activated ammonia reacts with dichlorosilane to deposit a molecular layer of silicon nitride, the reaction product 180, on the surface of the wafer W. Because the dichlorosilane is discontinuously adsorbed on the surface of the wafer W, ammonia is easily contacted with an entire surface of dichlorosilane. Therefore, dichlorosilane can be sufficiently nitrided to form a dense silicon nitride film.

Also, as described above, if adsorption inhibiting radicals such as chlorine radicals are physisorbed on the adsorption site 140, by supplying the activated reactant gas 170, the adsorption inhibiting radicals will be blown off and most or all of the adsorption inhibiting region 150 will disappear.

Thus, in order to perform deposition by ALD (Atomic Layer Deposition), after the raw material gas 160 needs to be adsorbed onto the surface of the wafer W (more accurately, the surface of the adsorption site 140), a reactant gas such as nitride gas must be supplied to deposit a thin film of the reaction product 180. However, in order to improve quality of a thin film (film quality), it is necessary to react the raw material gas 160 sufficiently with the reactant gas 170, and to deposit a dense (high density) thin film.

In order to improve quality of a deposited film, activated reactant gas 170 is supplied to the raw material gas 160 adsorbed on the surface of the wafer W, and a refining process for improving film quality is frequently performed. The activated reactant gas 170 is generated, for example, by plasma activation of the reactant gas 170. In the present embodiment, ammonia which is a nitride gas is activated by a plasma generator 80 and the activated ammonia is supplied. This activation generates nitride plasma and nitride radicals.

While the refining step may be performed independently of the reaction product deposition step, the present embodiment describes a deposition method in which a reactant gas 170 activated by using a plasma in the reaction product deposition step is generated to perform refining and deposition of the reaction product concurrently.

That is, when or after during nitridation of the raw material gas 160, the refining step is performed by supplying the reactant gas (nitride gas) 170 activated by plasma to the wafer W. Here, if the raw material gas 160 is adsorbed on the entire surface of the wafer W, plasma nitridation by the activated reactant gas 170 is applied to only the surface of the raw material gas 160, and even if the refining step is performed for a long period of time, nitridation may not proceed. Thus, refining may not be sufficiently performed. This may be because the raw material gas 160 adsorbed on the surface of the wafer W is in a state of saturation, so that the nitride radicals do not reach the depths of the raw material gas 160 and an amount of nitridation becomes restricted.

Figure 13:
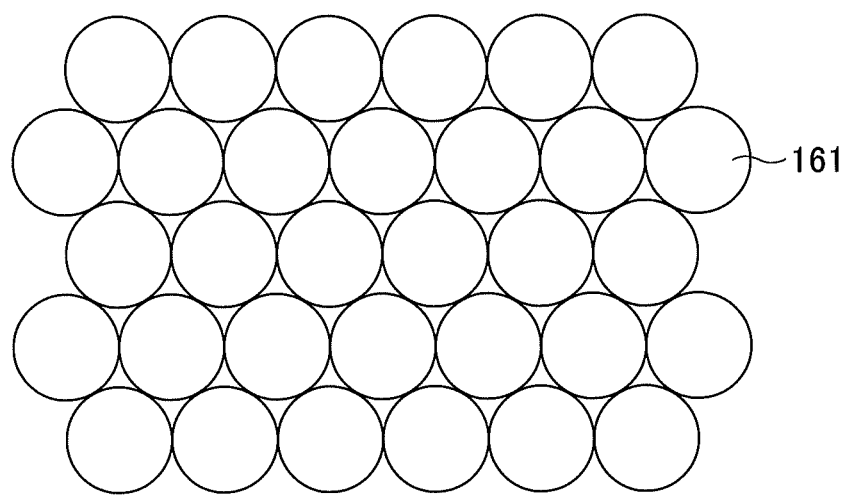
FIG. 13 is a diagram illustrating a deposition method according to a comparative example.
Figure 13:
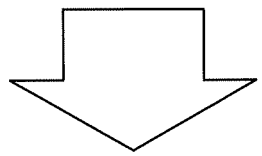
Figure 13:
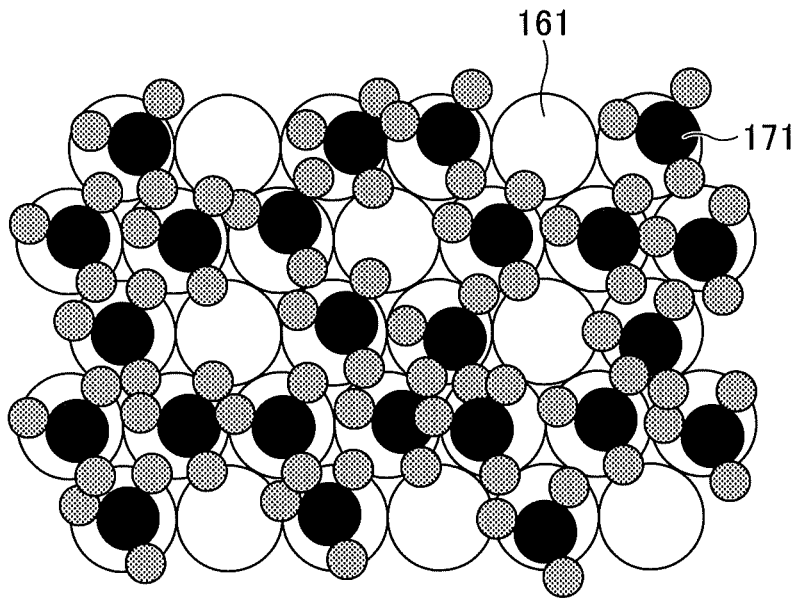

FIG. 13 is a diagram for explaining a deposition method according to a comparative example. That is, the diagram in FIG. 13 illustrates a problem when nitriding a raw material gas adsorbed on a surface of a wafer W in a saturated state.

FIG. 13 (a) illustrates a state in which dichlorosilane 161 of a raw material gas is adsorbed on the surface of the wafer W in a saturated state. In this case, molecules of dichlorosilane 161, which is the raw material gas, are closely adsorbed onto the surface of the wafer W, and there is little gap between adjacent molecules of dichlorosilane 161.

FIG. 13 (b) is a diagram illustrating a case in which activated ammonia 171 (ammonia plasma and/or ammonia radicals) as a reactant gas is supplied to the dichlorosilane 161 adsorbed in a saturated state. Because molecules of dichlorosilane 161 are arranged closely, the activated ammonia 171 which is a reactant gas can only be adsorbed onto a top surface of dichlorosilane 161. Thus, not all of the dichlorosilane 161 is nitrided by the activated ammonia 171. In such a state, even if activated ammonia 171 is supplied for a long time, nitridation of dichlorosilane 161 does not proceed sufficiently because only a top surface of the closely adsorbed molecules of dichlorosilane 161 can be nitrided. That is, nitridation is in a saturated state.

Figure 14:
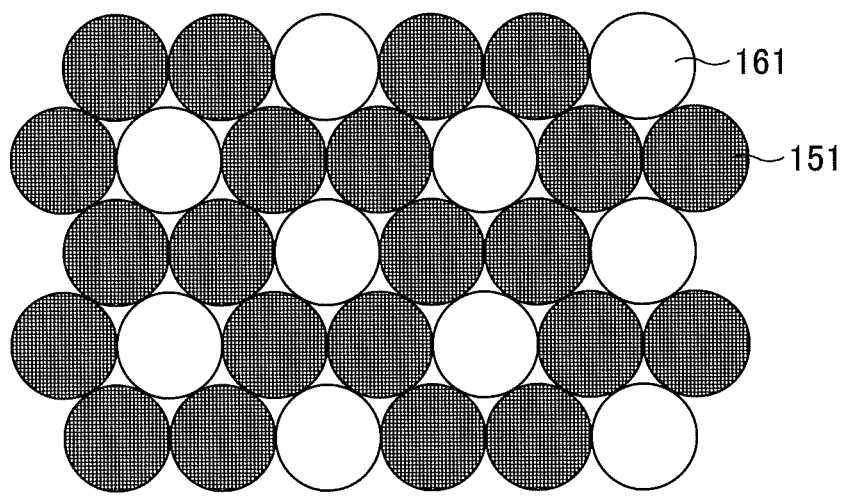
FIG. 14 is a diagram illustrating a deposition method according to the present embodiment.
Figure 14:
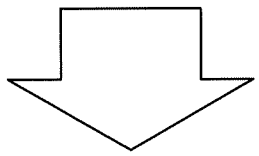
Figure 14:
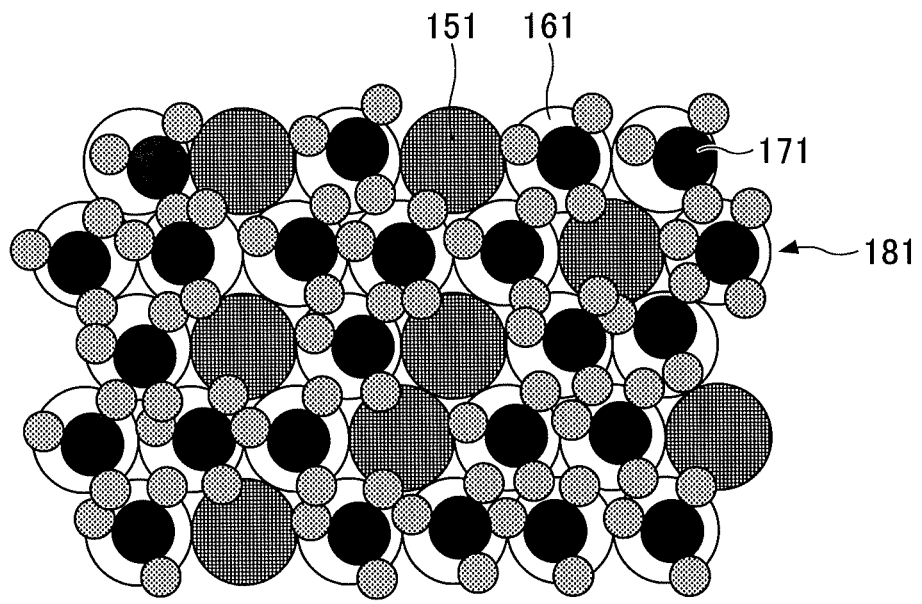

FIG. 14 is a diagram illustrating the deposition method according to the present embodiment. That is, FIG. 14 is a diagram illustrating a case of generating a reaction product from a predetermined amount of raw material gas adsorbed on a surface of a wafer W.

FIG. 14 (a) illustrates a state in which chlorine radicals 151 are adsorbed between molecules of the dichlorosilane 161. That is, the chlorine radicals 151 are adsorbed having discontinuities (gaps) on the adsorption site 140 (FIG. 12), and dichlorosilane 161 serving as the raw material gas is adsorbed discontinuously onto areas on which the chlorine radicals 151 are not adsorbed.

FIG. 14 (b) illustrates a state in which a silicon nitride film 181 is deposited, by supplying nitrogen radicals to the surface of the wafer W on which the dichlorosilane 161 is discontinuously adsorbed because of the presence of the chlorine radicals 151 serving as adsorption inhibiting radicals. As illustrated in FIG. 14 (b), because the molecules of dichlorosilane 161 are discontinuously adsorbed, the activated ammonia 171 can be adsorbed not only on the top surface but also on the side surface of the molecules of dichlorosilane 161, and can react well with the dichlorosilane 161. As described above, because the chlorine radicals 151 are adsorbed on the adsorption site 140 with physisorption, a sizable proportion of the chlorine radicals 151 is blown out when the activated ammonia 171 is supplied, and thereby exposed surfaces of the molecules of dichlorosilane 161 increase. Thus, the activated ammonia 171 can be adsorbed not only on the top surface but also on the side surface of the discontinuously adsorbed molecules of dichlorosilane 161, can enter deep gaps between molecules of dichlorosilane 161, and can react with the dichlorosilane 161. Accordingly, because nitridation of dichlorosilane 161 proceeds, a dense silicon nitride film 181 (that is, a high quality silicon nitride film 181) can be generated and deposited.

As described above, a dense silicon nitride film 181 can be formed by adsorbing the chlorine radicals 151 with presence of discontinuities (gaps), the chlorine radicals 151 serving as adsorption inhibiting radicals on the adsorption site 140, to form the adsorption inhibiting region 150 with discontinuities (gaps) and to control an adsorption amount of the dichlorosilane 161 serving as the raw material gas 160 to be supplied thereafter, by supplying the activated ammonia 171 serving as the reactant gas 170 and reacting the activated ammonia 171 with the dichlorosilane 161 while blowing out the chlorine radicals 151. As a result, it is possible to deposit a film with controlled film quality, and it is possible to control density of the thin film to be deposited.

The distance between the molecules of the dichlorosilane 161 is determined by an amount of deposition per cycle (note that the cycle mentioned here consists of a set of a single operation of adsorbing dichlorosilane 161 and a single nitridation operation. Hereinafter, an amount of deposition per cycle may also be referred to as a cycle rate). Thus, by controlling the cycle rate, a gap between the molecules of dichlorosilane 161 can be controlled, and thereby film quality can be controlled.

The description will return to FIG. 12.

In the raw material gas adsorption step and the reaction product deposition step of FIG. 12 (c) and FIG. 12 (d), supply of the raw material gas from the reactant gas nozzle 31 and supply of the nitride gas from the reactant gas nozzle 32 may be initiated simultaneously. As illustrated in FIGS. 2, 3, and 9, if the rotary table 2 is rotated clockwise, the wafer W reaches the raw material gas supply region P1 after passing through the chlorine radical supply region P3, and then reaches the nitride gas supply region P2. Therefore, even if the supply of the raw material gas and the supply of the nitride gas are started simultaneously, the nitriding step will be performed after the raw material gas adsorption step.

Also, during the raw material gas adsorption step and the reaction product deposition step illustrated in FIG. 12 (c) and FIG. 12 (d), supply of the adsorption inhibiting radicals may or may not be stopped. However, it is preferable that the supply of the adsorption inhibiting radicals is not stopped from a viewpoint of smoothly entering the next adsorption inhibiting region forming step. The chlorine radical adsorption step illustrated in FIG. 12 (b) is performed continuously by rotating the rotary table 2 at least once for a predetermined time, while the raw material gas adsorption step and the nitriding step illustrated in FIG. 12 (c) are performed by rotating the rotary table 2 only once. That is, in the configuration illustrated in FIGS. 2, 3, and 9, after the chlorine radicals are supplied to the wafer W on the rotary table 2 in the third processing region P3, the raw material gas is supplied to the wafer W in the first processing region P1, and the raw material gas adsorbed on the surface of the wafer W in the second processing region P2 is nitrided to deposit a molecular layer of SiN film on the wafer W. Thereafter, the wafer W immediately enters the third processing region P3 so that the chlorine radicals are supplied to the wafer W. Accordingly, a series of steps illustrated in diagrams (b) to (d) in FIG. 12 can be performed continuously without stopping the supply of the chlorine radicals.

Although the reaction product deposition step (or nitriding step) of FIG. 12 (d) may be performed for a longer time, it is preferable to control adsorption amount of the raw material gas 160 so that sufficient nitridation can be achieved even by rotating the rotary table 2 only once. That is, by reducing the adsorption amount of the raw material gas 160, it is possible to perform deposition of sufficient film density even in a single nitridation.

Also, in the raw material gas adsorption step and the nitriding process of FIGS. 12 (c) and (d), the raw material gas 160 is nitrided to terminate with an amino group of $NH_2$ structure, and thereby the adsorption site 140 with respect to the raw material gas 160 is formed. Thereafter, when chlorine radicals, which are adsorption inhibiting radicals, are supplied in the adsorption inhibiting region forming step of FIG. 12 (*b*), a hydrogen atom (H) in the $NH_2$ structure is replaced by a chlorine atom (Cl). As described above, because dichlorosilane is a chlorine-containing gas and chlorines are not adsorbed to each other, the raw material gas 160 is not adsorbed to a part terminated with chlorine. Accordingly, the part terminated with Cl functions as an adsorption inhibitor, and prevents the raw material gas 160 being adsorbed. Thus, by Cl atoms being adsorbed with discontinuities (gaps) on the surface of the wafer W, the adsorption amount of the raw material gas 160 can be controlled.

The present embodiment describes an example in which the adsorption inhibiting radical is a chlorine radical and in which a raw material gas 160 is dichlorosilane containing chlorine and silicon. However, various combinations of an adsorption inhibiting radical and a raw material gas can be employed if the combination can form the adsorption inhibiting region 150 for the raw material gas 160.

A method for inhibiting adsorption is also not limited to the method utilizing electronegativity, and any principles or methods may be used if the principles or the methods can inhibit adsorption of the raw material gas 160.

As described above, by continuously repeating the steps illustrated in the diagrams (b) to (d) in FIG. 12, a dense and high-quality reaction product 180 is deposited on a surface of a wafer W. Due to an influence of chlorine radicals serving as an adsorption inhibitor, a deposition rate may slightly decrease relative to that of a conventional deposition method. However, because a high-quality thin film, to which sufficient plasma-based refining is applied, can be formed without performing an independent refining step, high-quality deposition can be performed without decreasing the throughput as a result.

FIG. 12 (*e*) is a diagram illustrating an example of a plasma-based refining step performed as needed. As described above, by controlling an adsorption amount of the raw material gas 160, it is possible to perform high-quality deposition without performing an independent plasma-based refining step. However, if it is desirable to combine an independent plasma-based refining process because an adsorption amount of the raw material gas 160 cannot be reduced sufficiently due to a required process, the independent plasma-based refining process may be performed as necessary.

In the plasma-based refining step of FIG. 12 (*e*), a nitride gas activated by the plasma generator 80 is supplied from the reactant gas nozzle 32 to a SiN film to perform plasma-based refining of the SiN film. This step is the same operation as the plasma-based refining step performed in FIG. 12 (*a*), but differs from the plasma-based refining step of FIG. (a) in that the step of FIG. 12 (*e*) is intended to refine the deposited silicon nitride film. If nitridation of the silicon nitride film that is performed while rotating the rotary table 2 once is insufficient, the silicon nitride film can be sufficiently nitrided by supplying the nitride gas activated by plasma while supply of the raw material gas 160 is stopped, and thereby a high-density and high-quality silicon nitride film can be formed. The plasma-based refining step of FIG. 12 (*e*) is performed while supplying only the nitride gas activated by plasma and the separation gas, and the raw material gas and the chlorine radicals are not supplied. The plasma-based refining step causes the surface of the wafer W to be nitrided and modified by plasma.

Note that the plasma-based refining step may be performed as necessary, as in the plasma-based refining step of FIG. 12 (*a*), and is not essential. This step may selectively be performed when only a special requirement, such that high-quality deposition must be performed without excessively decreasing an adsorption amount of the raw material gas 160, needs to be satisfied.

When deposition is completed, supply of all of the gases and operations of the plasma generators 80 and 90 are stopped, and rotation of the rotary table 2 is stopped. Then, the wafers W are sequentially unloaded from the vacuum vessel 1 in an opposite procedure to the procedure for loading the wafers. That is, a procedure for lifting the wafer W with the lift pins and for unloading the wafer W from the vacuum vessel 1 is repeated, while the rotary table 2 is rotated and stopped intermittently. The surface of the wafer W is coated with a conformal and high-quality silicon nitride film.

As described above, in the deposition method according to the present embodiment, a high-quality silicon nitride film can be formed on a surface of a wafer W. Although FIG. 12 illustrates an example of depositing a silicon nitride film on a flat surface of a wafer W, a surface of a wafer to which the deposition method according to the present embodiment is applicable is not limited to a flat surface. To various patterns of surfaces, such as a recess pattern including a trench, a via-hole, and a like, deposition of a film of high-quality can be performed. In diverse semiconductor manufacturing processes, there are a large number of requests for depositing a high-quality film on various patterns such as a trench and a via. The deposition method and the deposition apparatus according to the present embodiment satisfy such requests for high-quality deposition, and are applicable to various applications.

In the present embodiment, an example of applying the deposition method according to the present embodiment to atomic layer deposition (ALD) using an ALD system of rotary table type has been described. However, the deposition method, in which an adsorption inhibiting region 150 with discontinuities (gaps) is formed on the adsorption site 140 by causing the adsorption site 140 to adsorb a predetermined amount of adsorption inhibiting radicals in order to control the adsorption amount of the raw material gas 160, is also applicable to chemical vapor deposition (CVD). Also, the deposition method is applicable to ALD systems other than a rotary-type ALD system, and CVD system. In CVD, the steps of (c) and (d) in FIG. 12 are performed simultaneously. This is because an adsorption amount of the raw material gas 160 can be controlled if the adsorption inhibiting region 150 is formed dispersively.

From such a viewpoint, it is possible to apply the deposition method according to the present embodiment to various systems, such as a CVD system of single-wafer type, ALD system of single-wafer type, or a vertical heat treatment device in which wafers W are loaded into a processing container and heat treatment is performed while supplying gas to the processing container.

That is, if ALD or CVD is performed after an adsorption inhibiting region 150 is dispersively formed in the adsorption inhibiting region forming step of FIG. 12 (*b*), adsorption amount of the raw material gas can be controlled, and high-quality deposition can be performed while controlling film quality.

As described above, types of thin films to be formed can be applied to various processes of forming thin films, if the adsorption inhibiting region 150 for the raw material gas 160 can be formed dispersively while the adsorption site 140 with respect to the raw material gas 160 is formed, and an adsorption amount of the raw material gas 160 can be controlled.

EXAMPLES

Next, examples in which the deposition method according to the present embodiment is performed will be described together with a comparative example.

Figure 15:
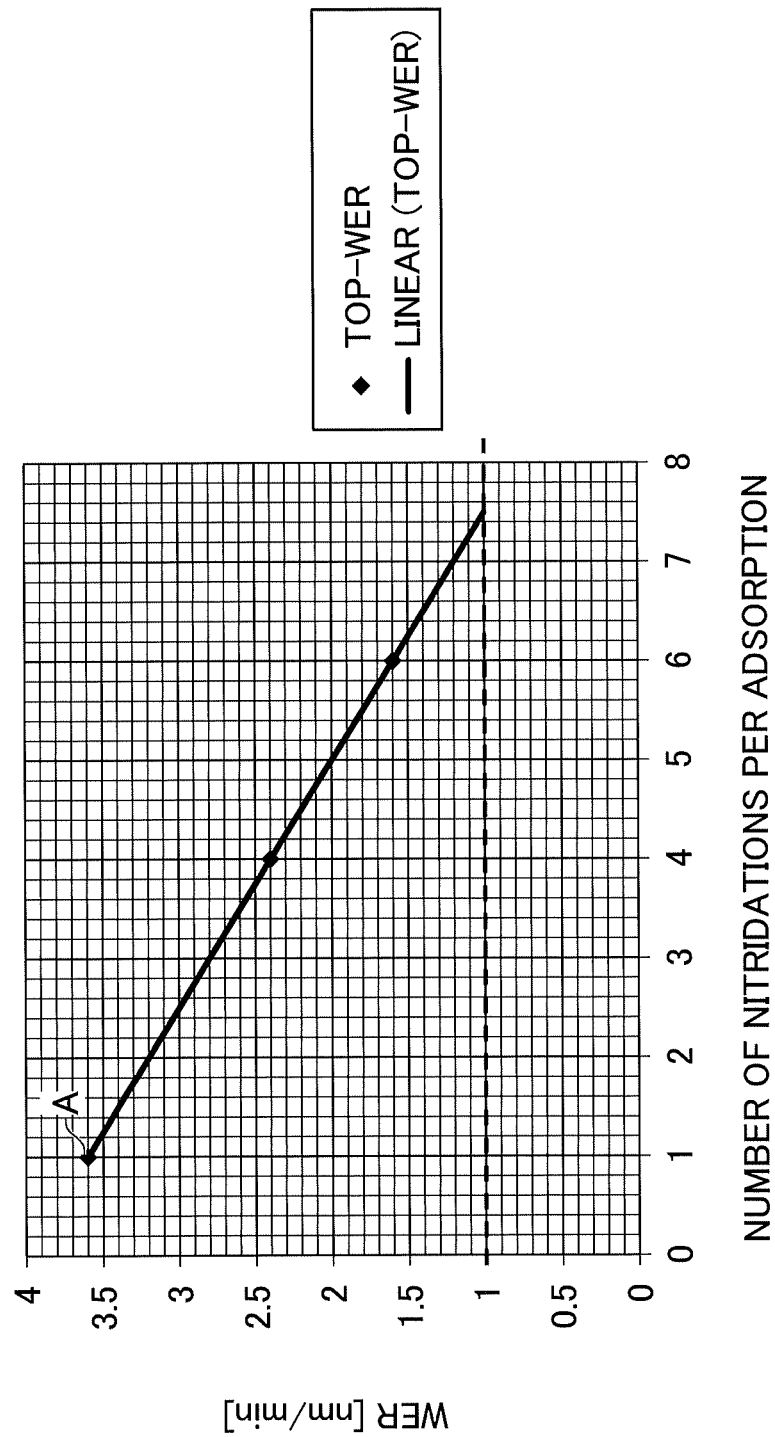
FIG. 15 is a result of performing the deposition method according to the comparative example.

FIG. 15 is a result of performing a deposition method according to a comparative example. This is a diagram illustrating a relationship between the number of nitridations applied to a deposited silicon nitride film and an etching rate of the silicon nitride film when the silicon nitride film is formed without adsorbing chlorine radicals. The etching rate is an indicator indicating density of the film indirectly. If an etching amount per unit time is lower, it means that the density of the film is higher and the film is of higher quality.

FIG. 15 illustrates how the etching rate varies by increasing the number of nitridations for a single adsorption of a raw material gas 160, in a case in which deposition is performed by using the ALD system of rotary table type that is illustrated in FIGS. 1 to 9. A horizontal axis indicates the number of nitridations per adsorption, and a vertical axis indicates the etching rate (nm/min) of the thin film.

With respect to a result in FIG. 15, a condition of deposition is that a cycle rate (an amount of deposition per cycle: a cycle consists of a set of a single operation of adsorbing raw material gas and a single nitridation operation) is 0.059 nm/cycle. FIG. 15 indicates that the etching rate decreases proportionally to the number of nitridations. That is, under a condition of a cycle rate of 0.059 nm/cycle, the etching rate of the thin film is reduced proportionally to the increase of the number of nitridations, and the density of the thin film is increased.

FIG. 15 indicates that, for example, if a target etching rate (an index proportional to a target film density) is 1 (nm/min), 7.5 nitridation times (i.e. 7.5 nitridation operations) are required.

Figure 16:
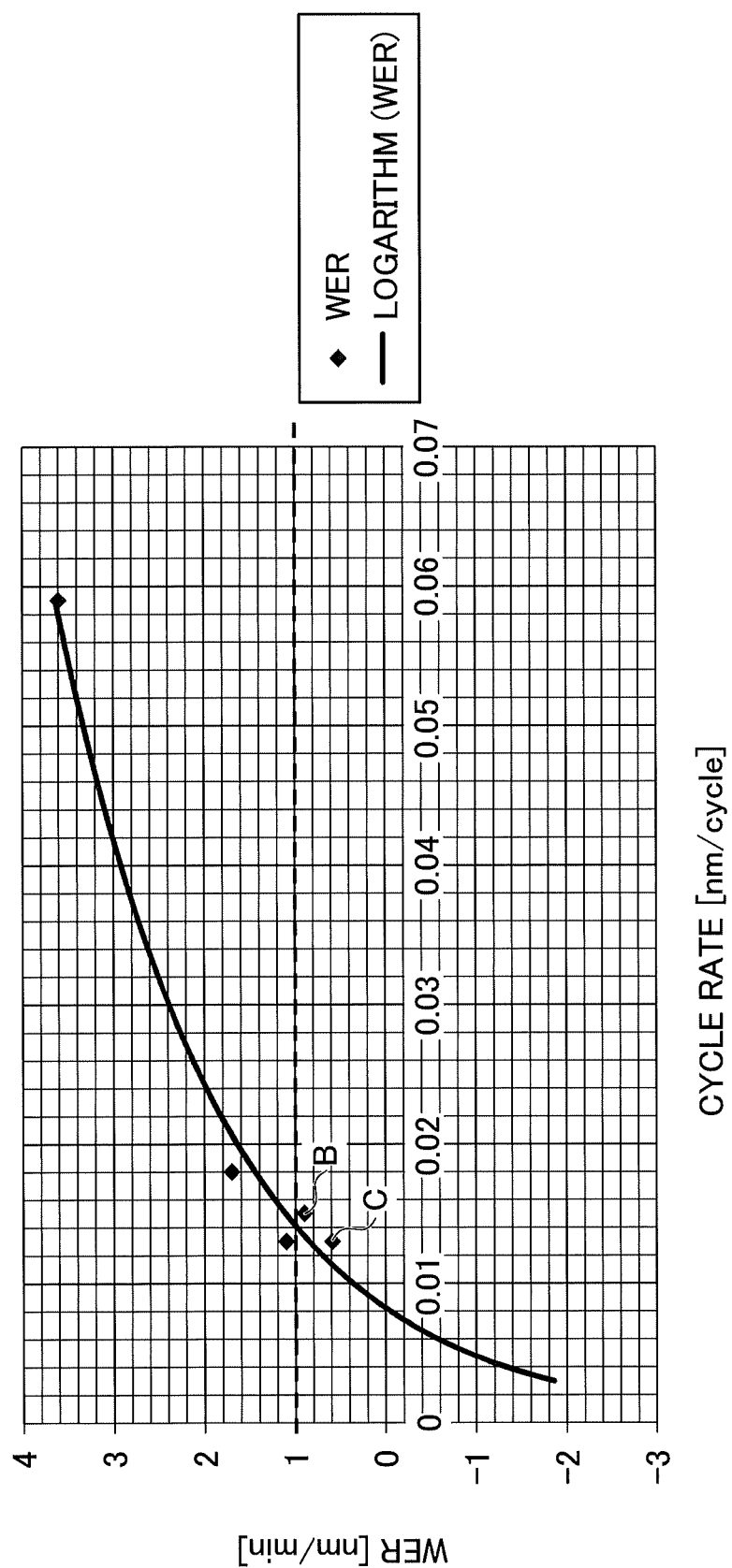
FIG. 16 is a diagram illustrating a relationship between a cycle rate and an etching rate, which are obtained by performing the deposition method according to the present embodiment while varying cycle rates.

FIG. 16 is a diagram illustrating a relationship between an etching rate and a cycle rate, in a case in which the deposition method according to the present embodiment is performed.

If a target etching rate is 1 (nm/min), FIG. 16 indicates that the cycle rate may be set to approximately 0.015 (nm/cycle) to achieve the target etching rate. In other words, FIG. 16 indicates that, if the deposition method according to the present embodiment is employed, by lowering the cycle rate to approximately 0.015 (nm/cycle), the target etching rate of 1 (nm/min) can be achieved with a single nitridation operation. On the other hand, as illustrated in FIG. 15, a comparative example in FIG. 15 requires 7.5 nitridation times to attain the target etching rate.

Comparison with the conventional example (comparative example) in FIG. 15 will be described. In the comparative example, the etching rate is approximately 3.6 (nm/min) in a case of single nitridation (point A in FIG. 15). In the present embodiment, the etching rate in a case of single nitridation can be lowered to 0.9 (nm/min) if the cycle rate is set to approximately 0.015 (nm/cycle) (point B in FIG. 16, which is an actual value closest to the target etching rate of 1 (nm/min)). Furthermore, in the present embodiment, if the cycle rate is set to 0.013 (nm/cycle), the etching rate of 0.6 (nm/min), which is below the target etching rate of 1 (nm/min), can be achieved (point C in FIG. 16). As illustrated in FIG. 16, when the cycle rate is 0.008 (nm/cycle), the etching rate becomes zero. When the cycle rate is 0.042 (nm/cycle), the etching rate becomes 3 (nm/min). When the cycle rate is approximately 0.024 (nm/cycle), the etching rate becomes 2 (nm/min). When the cycle rate is 0.020 (nm/cycle), the etching rate becomes approximately 1.6 (nm/min). When the cycle rate is 0.016 (nm/cycle), the etching rate becomes approximately 1.2 (nm/min). Thus, a range of the cycle rate may preferably be greater than 0.008 (nm/cycle) and not greater than 0.042 (nm/cycle), more preferably be greater than 0.008 (nm/cycle) and not greater than 0.024 (nm/cycle), further more preferably be greater than 0.008 (nm/cycle) and not greater than 0.020 (nm/cycle), yet further more preferably be greater than 0.008 (nm/cycle) and not greater than 0.016 (nm/cycle), and most preferably be greater than 0.008 (nm/cycle) and not greater than 0.015 (nm/cycle). The lower limit of the cycle rate may be 0.0010 (nm/cycle), which is a value when the etching rate becomes 0.4 (nm/min).

That is, FIG. 16 indicates that the deposition method according to the present embodiment attains film quality close to the target etching rate by applying a single nitridation operation.

Figure 17:
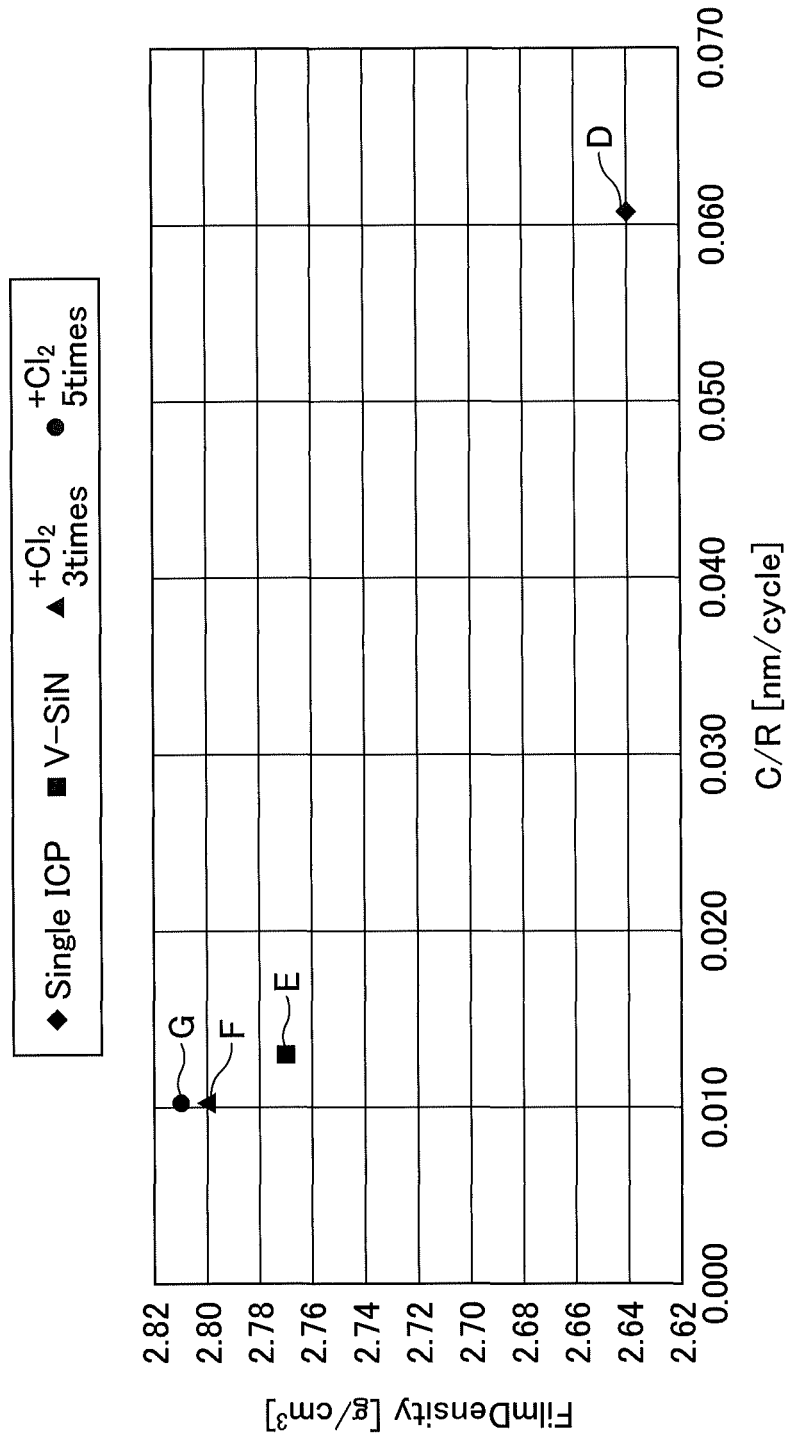
FIG. 17 is a diagram illustrating a relationship between the cycle rate and film density with respect to the present embodiment and the comparative example.

FIG. 17 is a diagram illustrating the relationship between a cycle rate (nm/cycle) and film density (g/cm$^3$) with respect to the present embodiment and the comparative example. In FIG. 17, point D indicates a result of the deposition method according to the comparative example that does not perform the adsorption inhibiting region forming step, and points E to G indicate results of the deposition method according to the present embodiment. The point E indicates the result of a first example of the deposition method according to the present embodiment, the point F is the result of a second example of the deposition method according to the present embodiment, and the point G is the result of a third example of the deposition method according to the present embodiment. In the first example, the adsorption inhibiting region forming step is performed only during a period corresponding to a single rotation of the rotary table 2. In the second example, the adsorption inhibiting region forming step is performed during a period for rotating the rotary table 2 three times. In the third example, the adsorption inhibiting region forming step is performed during a period for rotating the rotary table 2 five times.

As illustrated in FIG. 17, film density of the comparative example indicated by the point D is 2.64 g/cm$^3$, which is the lowest of all of the results. Film density of the first example indicated by the point E is approximately 2.77 g/cm$^3$, which is 0.13 g/cm$^3$ higher than that of the comparative example, indicating a significant improvement in film density. Further, film density of the second example indicated by the point F is approximately 2.80 (g/cm$^3$), which is improved by 0.03 (g/cm$^3$) compared to the first example. Further, film density of the third example indicated by the point G is approximately 2.81 (g/cm$^3$), which is further improved by 0.01 (g/cm$^3$) compared to the second embodiment.

Thus, according to the results in FIG. 17, it is found that the deposition method according to the first to third examples can significantly improve film density per cycle as compared to the deposition method according to the comparative example. In addition, the results of the first to third examples indicate that film density can be improved by performing the adsorption inhibiting region forming step for a longer time. However, the difference between the first example (point E), in which the adsorption inhibiting region forming step was performed for a period of a single rotation of the rotary table 2 (corresponding to one cycle), and the second example (point F), in which the adsorption inhibiting region forming step was performed for a period of three rotations of the rotary table 2 (corresponding to three cycles), is relatively large as 0.03 (g/cm³), whereas the difference between the second example (point F) and the third example (point G) in which the adsorption inhibiting region forming step was performed for a period of five rotations of the rotary table 2 (corresponding to five cycles) is small as 0.01 (g/cm³). Accordingly, it is possible to determine the adsorption amount of the adsorption inhibiting radicals in the adsorption inhibiting region forming step by considering a relationship between target film density and throughput. That is, according to FIG. 17, if higher film density is required, five cycles of the adsorption inhibiting region forming step may be performed as in the third example. However, if moderate film density and moderate throughput are required, three cycles of the adsorption inhibiting forming step may be performed as in the second example. Further, if required film density can be achieved by performing the first example, the film quality can be improved without decreasing throughput by performing one cycle of the adsorption inhibiting region forming step.

As described above, because film density can be controlled by controlling the adsorption amount of the adsorption inhibiting radical, various process conditions can be set in accordance with application, taking into account the relationship between required film density and throughput.

Figure 18:
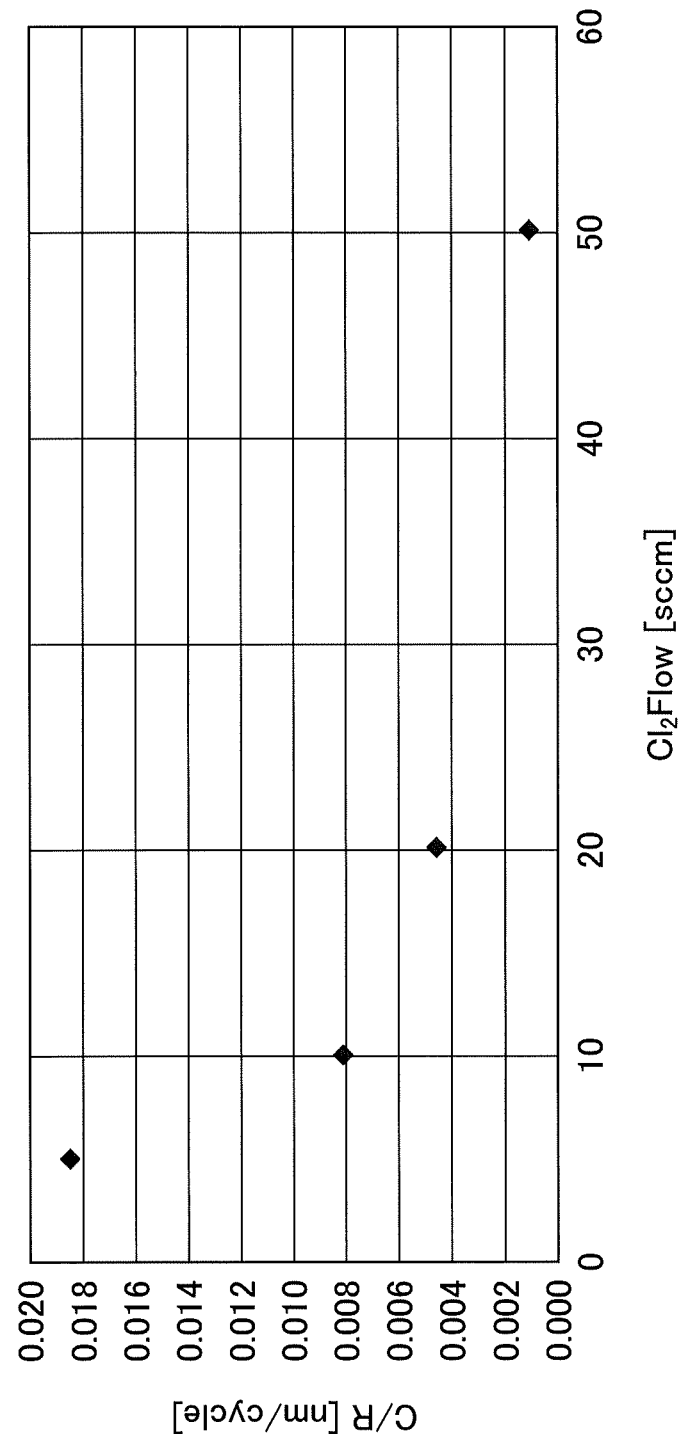
FIG. 18 is a diagram illustrating a relationship between a flow rate of chlorine gas and the cycle rate with respect to the present embodiment and the comparative example.

FIG. 18 is a diagram illustrating a relationship between a flow rate (sccm) of chlorine gas and the cycle rate (nm/cycle), with respect to the present embodiment and the comparative example. In FIG. 18, a horizontal axis represents the flow rate (sccm) of chlorine gas, which is an adsorption inhibiting gas, and a vertical axis represents the cycle rate (nm/cycle).

As illustrated in FIG. 18, as the flow rate of chlorine gas is increased, an amount of deposition per cycle, that is, a cycle rate (nm/cycle), decreases. That is, because a cycle rate can be reduced by increasing the flow rate of chlorine gas which is an adsorption inhibiting gas, the cycle rate as described in FIG. 16 can be realized. This indicates that an amount of adsorption of the adsorption inhibiting radicals can be controlled not only by a length of time for supplying chlorine gas, but also by the flow rate of chlorine gas.

Thus, because the amount of adsorption of adsorption inhibiting radicals can be controlled at both the length of time for supplying the adsorption inhibiting radicals and the flow rate of the adsorption inhibiting radicals, the amount of adsorption of a raw material gas can be controlled. By controlling the amount of adsorption of the raw material gas, a degree of nitridation can be controlled, and thereby film density (that is, film quality) can be controlled. Specifically, as described above, if film density is to be increased, the adsorption amount of the adsorption inhibiting radical may be increased in order to reduce a cycle rate.

As described above, according to the deposition method of the present embodiment and the above-described examples, quality of a film to be deposited can be controlled by controlling an adsorption amount of the adsorption inhibiting radicals. Also, as described above, the deposition method according to the present embodiment and the above-described examples can be applied to various thin film deposition processes and deposition devices.

Although the preferred embodiments and examples of the present invention have been described in detail, the present invention is not limited to the above-described embodiments and examples, and various modifications and substitutions may be made without departing from the scope of the present invention.

What is claimed is:

1. A deposition method comprising:
forming an adsorption inhibiting region on an adsorption site formed on a plurality of substrates placed on a rotary table along a circumferential direction of the rotary table, by causing the adsorption site to adsorb adsorption inhibiting radicals by a predetermined amount, the adsorption inhibiting radicals being dispersively supplied to the adsorption site from gas discharge holes provided on a face of a fan-shaped showerhead extending along a radial direction of the rotary table, said face being parallel to the rotary table, said fan-shaped showerhead including a projecting strip provided on a surface at an outer periphery of the fan-shaped showerhead facing the rotary table, said fan-shaped showerhead having a thickness at the projecting strip in a direction perpendicular to a face of the fan-shaped showerhead facing the rotary table, said thickness being greater than a thickness of a part of the fan-shaped showerhead where the gas discharge holes are provided, said projecting strip extending on a circular arc of the fan-shaped showerhead, said gas discharge holes not being provided on the projecting strip;
causing an area on the adsorption site, on which the adsorption inhibiting region is not formed, to adsorb a raw material gas; and
depositing a film of a reaction product on the adsorption site by causing the raw material gas adsorbed on the adsorption site to react with a reactant gas activated by a plasma, wherein the adsorption inhibiting radicals is supplied while steps of adsorbing the raw material and depositing the film are performed,
wherein the method further comprises controlling an amount of the adsorption inhibiting radicals to be adsorbed by adjusting number of rotations of the rotary table while continuously supplying the adsorption inhibiting radicals, thereby controlling a film density of the reaction product, and
wherein the film is formed while blowing out the adsorption inhibiting radicals from the adsorption site by supplying the raw material gas.

2. The deposition method according to claim 1, wherein the adsorption inhibiting radicals are generated by a remote plasma generator.

3. The deposition method according to claim 1, wherein the reactant gas is activated by an inductively coupled plasma.

4. The deposition method according to claim 1, wherein the amount of the raw material gas to be adsorbed is decreased by increasing the amount of the adsorption inhibiting radicals to be adsorbed, in order to increase the film density of the reaction product.

5. The deposition method according to claim 1, wherein the amount of the adsorption inhibiting radicals to be adsorbed is set such that the amount of the raw material gas to be adsorbed is equal to or less than a predetermined amount.

6. The deposition method according to claim 5, wherein the forming of the adsorption inhibiting region is performed for a longer time as compared to the causing to adsorb the raw material gas and the depositing of the film of the reaction product.

7. The deposition method according to claim 6, wherein the forming of the adsorption inhibiting region, the causing to adsorb the raw material gas, and the depositing of the film of the reaction product are repeated periodically, to deposit molecular layers of the reaction product gradually.

8. The deposition method according to claim 1, wherein the adsorption inhibiting radicals are chlorine radicals, the raw material gas contains chlorine and silicon, the reactant gas is a nitride gas, and the film of the reaction product is a silicon nitride film.

9. The deposition method according to claim 8, wherein an amount of the raw material gas to be adsorbed in one cycle of performing the causing to adsorb the raw material gas and the depositing of the film of the reaction product is greater than 0.008 nm and not greater than 0.042 nm.

10. The deposition method according to claim 9, further comprising supplying a purge gas on a surface of the plurality of substrates; wherein
the supplying of the purge gas is performed between the forming of the adsorption inhibiting region and the causing to adsorb the raw material gas, and between the causing to adsorb the raw material gas and the depositing of the film of the reaction product.

11. The deposition method according to claim 10, further comprising nitriding the surface of the plurality of substrates by supplying the nitride gas activated by the plasma, the nitriding being perfolined before the forming of the adsorption inhibiting region is first performed.

12. The deposition method according to claim 10, wherein the rotary table is disposed in a processing chamber;
the processing chamber includes, above the rotary table, a chlorine radical adsorbing region capable of supplying the chlorine radicals onto the rotary table, a first purging region capable of supplying the purge gas onto the rotary table, a raw material gas adsorbing region capable of supplying the raw material gas onto the rotary table, a second purging region capable of supplying the purge gas onto the rotary table, and a nitridation region capable of supplying the activated nitride gas onto the rotary table;
the forming of the adsorption inhibiting region is performed by rotating the rotary table a first predetermined number of times, while the chlorine radicals are supplied in the chlorine radical adsorbing region and the purge gas is supplied in the first purging region and in the second purging region, and while the raw material gas and the activated nitride gas are not supplied in the raw material gas adsorbing region and the nitridation region respectively; and
the causing to adsorb the raw material gas and the depositing of the silicon nitride film are performed by rotating the rotary table a second predetermined number of times, while the chlorine radicals are supplied in the chlorine radical adsorbing region, the purge gas is supplied in the first purging region and in the second purging region, the raw material gas is supplied in the raw material gas adsorbing region, and the activated nitride gas is supplied in the nitridation region.

13. The deposition method according to claim 12, wherein the first predetermined number is equal to or greater than the second predetermined number.

14. The deposition method according to claim 12, wherein the second predetermined number is 1.

15. The deposition method according to claim 12, wherein an amount of the chlorine radicals to be adsorbed is controlled by the first predeteiuiined number.

16. The deposition method according to claim 12, wherein the chlorine radical adsorbing region, the first purging, the raw material gas adsorbing region, the second purging region, and the nitridation region are arranged along a rotational direction of the rotary table.

17. The deposition method according to claim 1, wherein the reactant gas contains ammonia.

18. The deposition method according to claim 1, wherein the raw material gas is dichlorosilane.

19. The deposition method according to claim 1, wherein the showerhead is provided so as to have a gap ranging from 0.5 mm to 5.0 mm with the rotary table, and the showerhead includes gas discharge holes to discharge the adsorption inhibiting radicals, said gas discharge holes being provided so that the number of the gas discharge holes per unit area becomes greater from a rotational center of the rotary table to a periphery thereof.

20. The deposition method according to claim 1, wherein the method further comprises supplying a nitride gas that is activated by a plasma generator and refining the film of the reaction product.

* * * * *